(12) United States Patent
Maloney et al.

(10) Patent No.: US 7,074,640 B2
(45) Date of Patent: *Jul. 11, 2006

(54) METHOD OF MAKING BARRIER LAYERS

(75) Inventors: David J. Maloney, Pleasanton, CA (US); Wai M. Lee, Fremont, CA (US); Paul J. Roman, Jr., San Ramon, CA (US); Michael A. Fury, San Francisco, CA (US)

(73) Assignee: Simon Fraser University, Burnaby (CA)

( * ) Notice: Subject to any disclaimer, the term of this patent is extended or adjusted under 35 U.S.C. 154(b) by 42 days.

This patent is subject to a terminal disclaimer.

(21) Appl. No.: 10/442,860

(22) Filed: May 20, 2003

(65) Prior Publication Data

US 2004/0164293 A1 Aug. 26, 2004

Related U.S. Application Data

(63) Continuation-in-part of application No. 09/875,115, filed on Jun. 6, 2001, now Pat. No. 6,566,276.
(60) Provisional application No. 60/209,947, filed on Jun. 6, 2000.

(51) Int. Cl.
*H01L 21/00* (2006.01)

(52) U.S. Cl. .............................. 438/82; 438/82; 438/758
(58) Field of Classification Search .................. 438/82, 438/758, 478, 608, 782, 96, 3, 69, 681, 738
See application file for complete search history.

(56) References Cited

U.S. PATENT DOCUMENTS

| | | | |
|---|---|---|---|
| 4,343,875 A | 8/1982 | Spickenreuther | 430/5 |
| 4,439,464 A | 3/1984 | Lauks | 427/76 |
| 4,770,590 A | 9/1988 | Hugues et al. | 414/172 |
| 5,140,366 A | 8/1992 | Shiozawa et al. | 355/53 |
| 5,178,989 A * | 1/1993 | Heller et al. | 430/323 |
| 5,272,099 A | 12/1993 | Chou et al. | 437/41 |
| 5,292,558 A * | 3/1994 | Heller et al. | 438/643 |
| 5,436,176 A | 7/1995 | Shimizu et al. | 437/27 |
| 5,486,176 A | 1/1996 | Hildebrand et al. | 606/71 |
| 5,534,312 A | 7/1996 | Hill et al. | 427/533 |

(Continued)

OTHER PUBLICATIONS

L.B. Geotting, et al., "Photoresist–free lithography of 3μm wide $WO_3$ lines from amorphous films of uranyl complexes," J. Materials Science 29 (1994) 6147–6151.

R.H. Hill, et al., "Molecular design for photo and elctron beam lithography with thin films of coordinating compounds," Materials Chemistry and Physics 43 (1996) 233–237.

(Continued)

*Primary Examiner*—David Nelms
*Assistant Examiner*—Thinh T. Nguyen
(74) *Attorney, Agent, or Firm*—Morgan, Lewis & Bockius LLP

(57) ABSTRACT

The present invention involves a low-temperature, photoresist-free method of fabricating a barrier layer on a flexible substrate. An embodiment involves the conversion of a precursor into a top-surface imaging layer during a direct patterning step. Preferred precursors are formed from a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

17 Claims, 30 Drawing Sheets

U.S. PATENT DOCUMENTS

| | | | |
|---|---|---|---|
| 5,627,087 A | 5/1997 | Hsu | 438/302 |
| 5,652,067 A | 7/1997 | Ito et al. | 428/690 |
| 5,652,166 A | 7/1997 | Sun et al. | 437/56 |
| 5,707,784 A * | 1/1998 | Oikawa et al. | 430/313 |
| 5,716,758 A | 2/1998 | Bae et al. | 430/312 |
| 5,766,784 A | 6/1998 | Baskaran et al. | 428/702 |
| 5,821,017 A | 10/1998 | Thompson et al. | 430/9 |
| 5,849,465 A | 12/1998 | Uchida et al. | 430/325 |
| 5,869,350 A | 2/1999 | Heeger et al. | 438/29 |
| 5,935,762 A | 8/1999 | Dai et al. | 430/312 |
| 5,989,759 A | 11/1999 | Ando et al. | 430/22 |
| 6,048,769 A | 4/2000 | Chau | 438/275 |
| 6,071,676 A | 6/2000 | Thomson et al. | 430/311 |
| 6,072,207 A | 6/2000 | Yoshimori et al. | 257/295 |
| 6,268,695 B1 | 7/2001 | Affinito | 313/504 |
| 6,307,087 B1 | 10/2001 | Buchwald et al. | 544/163 |
| 6,348,239 B1 | 2/2002 | Hill et al. | 427/533 |
| 6,413,645 B1 | 7/2002 | Graff et al. | 428/446 |
| 6,566,276 B1 * | 5/2003 | Maloney et al. | 438/758 |
| 6,638,645 B1 | 10/2003 | Sawai et al. | 428/690 |
| 6,696,363 B1 | 2/2004 | Lee et al. | 438/681 |
| 6,777,036 B1 | 8/2004 | Bravo Vasquez et al. | 427/533 |

OTHER PUBLICATIONS

A.A. Avey, et al., "Solid State Photochemistry of $Cu_2(OH_2)_2(O_2C(CH_2)_4CH_3)_4$ in Thin Films: The Photochemical Formation of High–Quality Films of Copper and Copper (I) Oxide. Demonstration of a Novel Lithographic Technique for the Patterning of Copper," J. Am. Chem. Soc., vol. 118, No. 1 (1996), pp. 237–238.

M. Gao, et al., "High efficiency photoresist–free Lithography of $UO_3$ patterns from amorphous films of uranyl complexes," J. Mat. Res., vol. 13, No. 5 (May 1998) 1379–1389.

S.L. Blair, et al., "Photochemistry of thin amorphous films of $Fe(CO)_4PPh_3$ on Si(III) surfaces," J. Organometallic Chem. 554 (1998) 63–73.

Tohge, N., et al., "Effects of UC–Irradiation on the Formation of Oxide Thin Films from Chemically Modified Metal–Alkoxides," Journal of Sol–Gel Science and Technology, vol. 2, No.1/2/3, Jan. 1994, pp. 581–585.

Hill, R.H., et al., "An Inorganic Approach to Photolithography: The Photolithograhic Deposition of Dielectric Metal Oxide Films," ACS Symposium Series, Washington DC, vol. 706, Sep. 7, 1997, pp. 53–66.

International Search Report for International Application No. PCT/US2004/015861, Internationa Filing Date May 17, 2004, dated May 3, 2005.

* cited by examiner

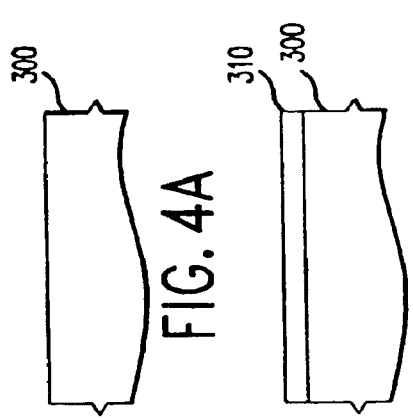
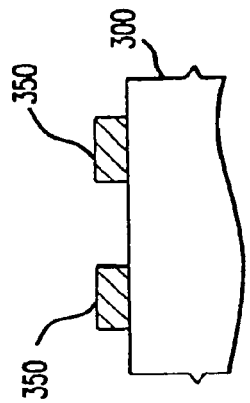
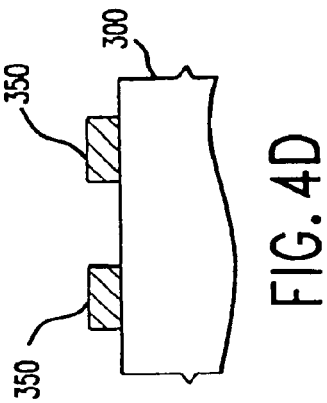
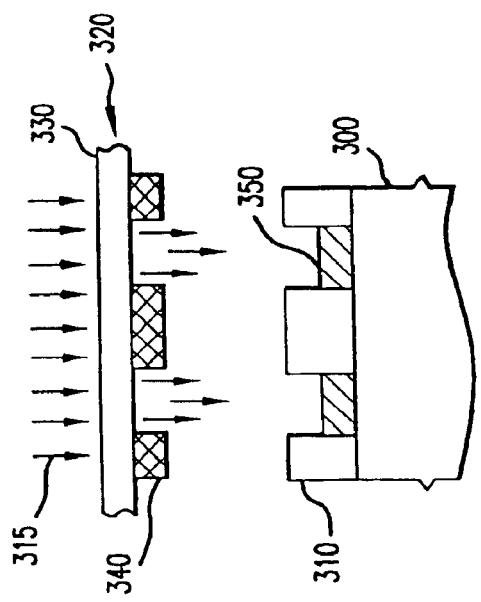

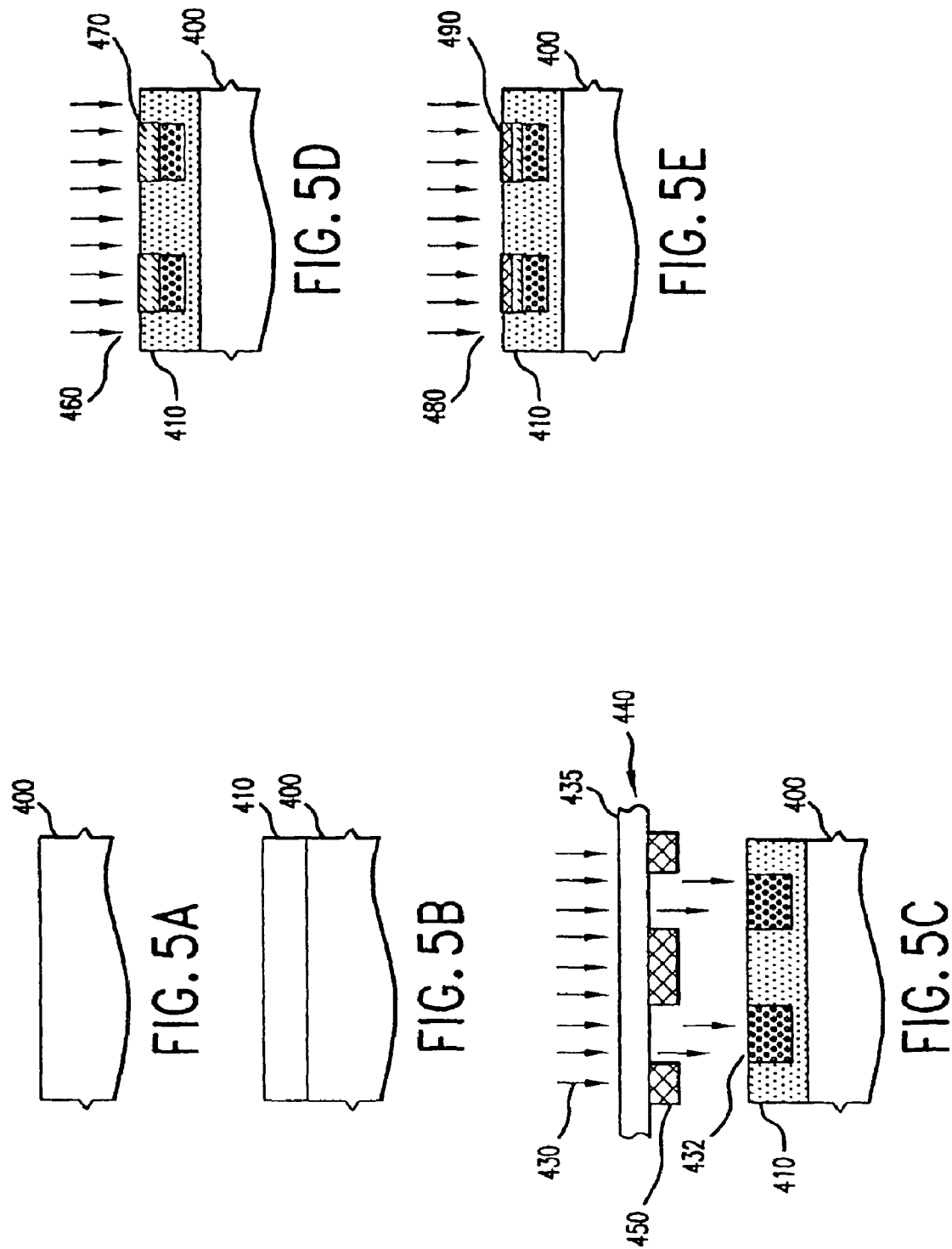

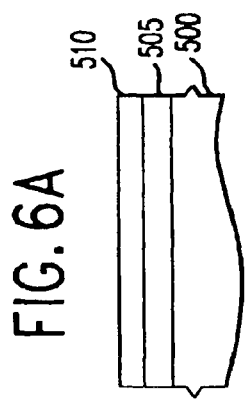
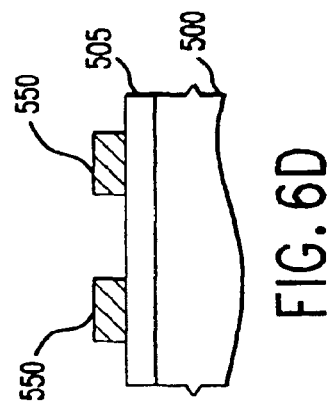
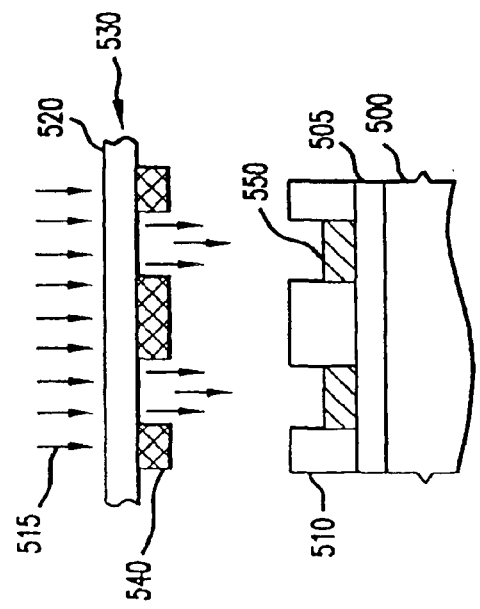

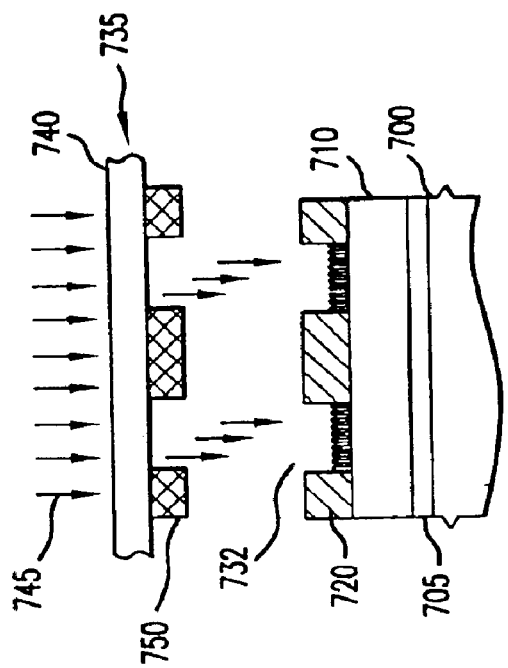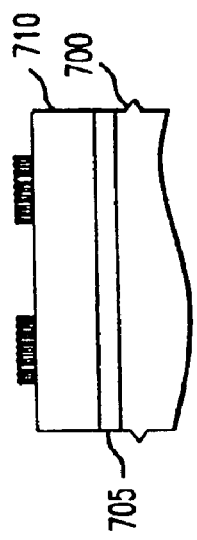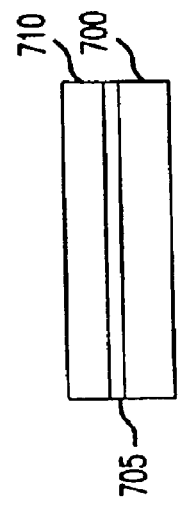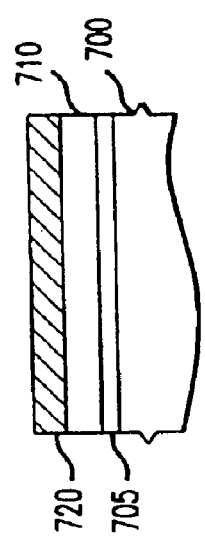

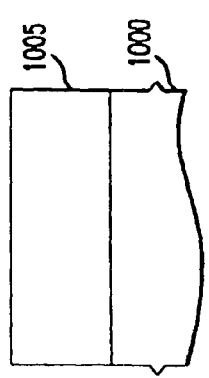
FIG.11A
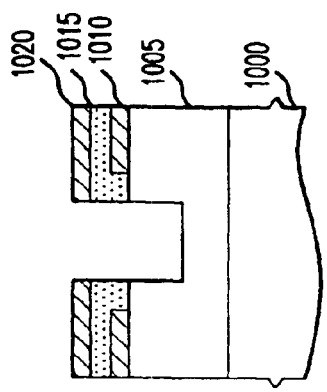
FIG.11D
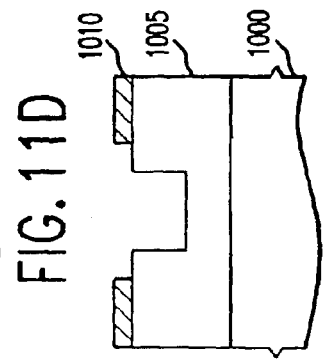
FIG.11E
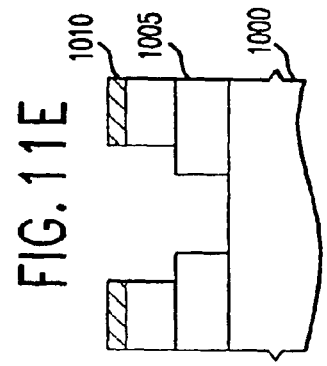
FIG.11F
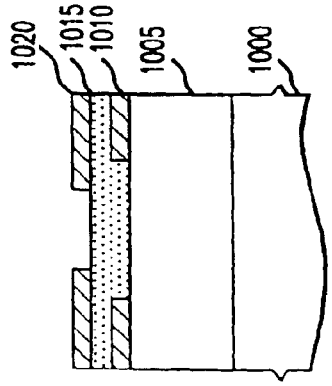
FIG.11B
FIG.11C

METHOD OF MAKING BARRIER LAYERS

CROSS REFERENCE TO RELATED APPLICATIONS

This is a continuation-in-part of application Ser. No. 09/875,115 to Maloney et al., published as U.S. Ser. No. 2002/0076495, that was filed Jun. 6, 2001 now U.S. Pat. No. 6,566,276 and is entitled "Method of Making Electronic Materials," which claims priority to provisional application Ser. No. 60/209,947, filed Jun. 6, 2000, both of which are hereby incorporated by reference in their entirety.

FIELD OF THE INVENTION

The present invention relates to improved organic electroluminescent devices and improved methods for manufacturing organic electroluminescent devices. In particular, the present invention relates to improved method of forming a barrier layer in such devices using a photochemical metal organic deposition process. An embodiment involves the direct photolytic conversion of a precursor material deposited over a substrate to act as a barrier layer.

Organic electroluminescent devices include organic light-emitting diodes and polymer light-emitting diodes. They are used in a number of devices, such as car radios, mobile phones, digital cameras, camcorders, personal digital assistants, and other devices using flexible and non-flexible displays.

BACKGROUND OF THE INVENTION

The semiconductor and packaging industries, among others, utilize conventional processes to form thin metal and metal oxide films in their products. Examples of such processes include evaporation, sputter deposition or sputtering, chemical vapor deposition ("CVD") and thermal oxidation. Evaporation is a process whereby a material to be deposited is heated near the substrate on which deposition is desired. Normally conducted under vacuum conditions, the material to be deposited volatilizes and subsequently condenses on the substrate, resulting in a blanket, or unpatterned, film of the desired material on the substrate. This method has several disadvantages, including the requirement to heat the desired film material to high temperatures and the need for high vacuum conditions. Unless a screen or shadow is employed during evaporation, an unpatterned, blanket film results from this process.

Sputtering is a technique similar to evaporation, in which the process of transferring the material for deposition into the vapor phase is assisted by bombarding that material with incident atoms of sufficient kinetic energy such that particles of the material are dislodged into the vapor phase and subsequently condense onto the substrate. Sputtering suffers from the same disadvantages as evaporation and, additionally, requires equipment and consumables capable of generating incident particles of sufficient kinetic energy to dislodge particles of the deposition material.

CVD is similar to evaporation and sputtering but further requires that the particles being deposited onto the substrate undergo a chemical reaction during the deposition process in order to form a film on the substrate. While the requirement for a chemical reaction distinguishes CVD from evaporation and sputtering, the CVD method still demands the use of sophisticated equipment and extreme conditions of temperature and pressure during film deposition.

Thermal oxidation also employs extreme conditions of temperature and an oxygen atmosphere. In this technique, a blanket layer of an oxidized film on a substrate is produced by oxidizing an unoxidized layer which had previously been deposited on the substrate.

Several existing film deposition methods may be undertaken under conditions of ambient temperature and pressure, including sol-gel and other spin-on methods. In these methods, a solution containing precursor particles that may be subsequently converted to the desired film composition is applied to the substrate. The application of this solution may be accomplished through spin-coating or spin-casting, where the substrates is rotated around an axis while the solution is dropped onto the middle of the substrate. After such application, the coated substrate is subjected to high temperatures which convert the precursor film into a film of the desired material. Thus, these methods do not allow for direct imaging to form. patterns of the amorphous film. Instead, they result in blanket, unpatterned films of the desired material. These methods have less stringent equipment requirements than the vapor-phase methods, but still require the application of extreme temperatures to effect conversion of the deposited film to the desired material.

In one method of patterning blanket films, the blanket film is coated (conventionally by spin coating or other solution-based coating method; or by application of a photosensitive dry film) with a photosensitive coating. This photosensitive layer is selectively exposed to light of a specific wavelength through a mask. The exposure changes the solubility of the exposed areas of the photosensitive layer in such a manner that either the exposed or unexposed areas may be selectively removed by use of a developing solution. The remaining material is then used as a pattern transfer medium, or mask, to an etching medium that patterns the film of the desired material. Following this etch step, the remaining (formerly photosensitive) material is removed, and any by-products generated during the etching process are cleaned away if necessary.

In another method of forming patterned films on a substrate, a photosensitive material may be patterned as described above. Following patterning, a conformal blanket of the desired material may be deposited on top of the patterned (formerly photosensitive) material, and then the substrate with the patterned material and the blanket film of the desired material may be exposed to a treatment that attacks the formerly photosensitive material. This treatment removes the remaining formerly photosensitive material and with it portions of the blanket film of desired material on top. In this fashion a patterned film of the desired material results; no etching step is necessary in this "liftoff" process. However, the use of an intermediate pattern transfer medium (photosensitive material) is still required, and this is a disadvantage of this method. It is also known that the "liftoff" method has severe limitations with regard to the resolution (minimum size) that may be determined by the pattern of the desired material. This disadvantage severely limits the usefulness of this method.

It is thus evident that the deposition of blanket films that need subsequently be patterned invokes the need for several extra costly and difficult processing steps.

In yet another method of forming patterned films, a blanket film of desired material may be deposited, e.g., by one of the methods described above, onto a substrate-that has previously been patterned, e.g., by an etching process such as the one described previously. The blanket film is deposited in such a way that its thickness fills in and completely covers the existing pattern in the substrate. A portion of the blanket film is then isotropically removed until the remaining desired material and the top of the previously patterned substrate sit at the same height. Thus, the desired material exists in a pattern embedded in the previously patterned substrate. The isotropic removal of the desired material may be accomplished via an etching process; commonly in the case of the formation of semiconductor devices it is envisioned that this removal is effected through a process known as chemical mechanical planarization ("CMP"). This involves the use of a slurry of particles in conjunction with a chemical agent to remove substantial quantities of the desired material through a combination of chemical and mechanical action, leaving behind the desired material in the desired places embedded in the patterned substrate. This method of forming a patterned film demands the use of expensive and complicated planarization equipment and extra consumable materials including planarization pads, slurries and chemical agents. In addition, the use of small slurry particles demands that these particles be subsequently removed from the planarized surface, invoking extra processing steps.

While some of these methods are more equipment-intensive than others and differ in the use of either solution- or vapor-phase methods, such conventional processes for forming metal and metal oxide films is not optimal because, for example, they each require costly equipment, are time consuming, require the use of high temperatures to achieve the desired result, and result in blanket, unpatterned films where, if patterning is needed, further patterning steps are required. Many of these methods suffer the additional disadvantage of, in many cases, forming polycrystalline films which may not be suitable for a variety of applications. A desirable alternative to these methods would be the use of a precursor material that may be applied to a substrate and selectively imaged and patterned to form an amorphous film without the need for intermediate steps.

One use of thin films in semiconductor processing is for the formation of thin top-surface imaging (hereafter "TSI") layers, typically atop organic layers that have already been applied to the substrate. In this instance, the organic layer need not be photoactive, since the thin film to be deposited will be subsequently patterned using conventional methods. The use of these thin films for TSI confers several process advantages, including resistance to plasma etching not afforded by the use of photoresist masks, and the increased resolution of the lithographic process afforded by a very thin film. Typical thin films for TSI include metal and silicon nitride and oxide films, and a great deal of research has also been conducted on a process known as silylation. This process involves the vapor deposition of a thin film of a silicon-containing species on top of a previously deposited organic layer. This thin film of the silicon species can then be imaged to form a thin film of silicon oxide, which acts as the TSI layer during oxygen-plasma patterning of the organic layer beneath. The acceptance of silylation processes by the semiconductor and packaging industries has been insignificant as a result of a number of process and cost limitations.

Another use of thin films in semiconductor processing is for the formation of hard masks, e.g., for use in ion implantation processing. Ion implantation is a well known technique used, for example, in forming doped regions in a substrate during semiconductor fabrication. Ion implantation frequently requires a patterned blocking layer, also known as a hard mask, which directs the ions to be implanted only into predetermined regions. For example, U.S. Pat. No. 5,436,176 to Shimizu et al. discloses, in "Embodiment 1", maskless implantation of a silicon substrate covered by a silicon oxide film, which is disclosed to be thrice-implanted with boron atoms. Alternatively, the same patent discloses, in "Embodiment 3", implantation using multiple hard masks in a thrice-repeated method comprising the following sequence of steps: forming a mask on a silicon substrate covered by a silicon oxide film, implantation with phosphorus, forming a second mask, implantation with boron, and, finally, annealing.

As previously discussed, formation of a hard mask by any of these processes requires a relatively large number of processes steps. Eliminating some of these steps before etching or ion implantation would be beneficial because, for example, it would simplify the process used, increase its efficiency and reduce its cost.

One approach to solve the problem involves the use of a photoresist as a mask. However, it is well known that photoresists have low etch resistance to certain plasma etching chemistries, particularly for the patterning of organic layers which may be employed as intermediate protecting layers or which are finding increasing use as low-dielectric constant ("low-k") dielectrics and low stopping power for ions. Therefore, undesirably thick photoresist films are required to permit complete etching of the layer to be patterned prior to complete erosion of the masking layer or to prevent implantation of the areas of the substrate onto which they are applied. Another disadvantage is that ion implanted photoresist can be exceedingly difficult to remove from a wafer. Other solutions to the problem have been attempted, for example, by first applying a hard mask, then applying a photoresist layer atop the hard mask followed by patterning before etching or ion implantation take place. Combining some of the many steps disclosed in the prior art methods before plasma etching or ion implantation, or even eliminating one or more of them, would help simplify these processes. Thus, a method to eliminate steps in a plasma patterning or an ion implantation process would be highly desirable.

The present processes for metal complex precursor deposition have been developed as less expensive methods of forming metal and metal oxide hard mask films. One embodiment of this process, photochemical metal organic deposition, involves the use of a metal organic for the metal complex precursor and a means for converting the metal organic to the metal or metal oxide film, such as incident radiation or thermal energy. Specifically, in this process, a precursor metal organic is applied to a surface, for example, by dissolving it in a suitable organic solvent to form a precursor solution, which is deposited onto a surface by any known means. The precursor is then at least partially converted to a metal or metal oxide layer by a partial converting means and/or converting means, such as by exposure to an energy source, e.g., light, ion-beam bombardment, electron-beam bombardment, or thermal or heat treatment or annealing. As such, the present processes have utility in, e.g., the semiconductor and packaging industries.

U.S. Pat. No. 5,534,312 to Hill et al. discloses a photoresist-free method for making a patterned, metal-containing material on a substrate which includes the steps of depositing an amorphous film of a metal complex on a surface of a substrate, placing the film in a selected atmosphere, and exposing selected areas of the film to electromagnetic radiation, preferably ultraviolet light and optionally through a mask, to cause the metal complex in the selected areas to undergo a photochemical reaction. However, this reference does not envision use of a patterned, metal-containing material as a hard mask to protect underlying layers from a plasma etching environment.

U.S. Pat. No. 6,071,676 to Thomson et al. discloses that its integrated circuit manufacturing process causes degradation of an applied compound where the compound is contacted by a radiant or particle beam. In other words, the dimensions of the deposit caused by degradation of the compound is proportional to the focal width of the irradiating beam. Nanoscale dimensions are disclosed to be achievable by that process. Where the compound degrades to form a deposit of a metallic or other conductive substance, then the method may be used to manufacture integrated circuits directly on a substrate. The deposit is taught to be, preferably, a metal or metal alloy, and the metals may be gold, tin or chromium, or the deposit may be a conductive non-metal or semi-metal, such as germanium. In a further aspect, there is provided a method for manufacturing an integrated circuit comprising applying to a substrate a compound which degrades under the effect of a radiant or particle beam to produce a conductive, preferably metallic, deposit, applying to selected surface areas of the compound a radiant or particle beam, and removing the degraded compound and the unaffected compound from the substrate.

The processes of the present invention can provide a patterned hard mask, thus replacing both the oxide and photoresist layers used in conventional TSI and ion implantation methods and, for example, simplifying those methods by reducing the number of processing steps which must be performed. Another advantage of this invention is that the material which is produced has better etch resistance to plasma etching chemistries. This confers still another advantage to the present process that allows for the use of extremely thin films as the hard mask, increasing the ultimate resolution of the lithographic process and allowing the formation of smaller and finer features. A further advantage of this invention is that the material which is produced has better ion implant blocking and stopping power. Additionally, the process of the present invention is advantageous in that it facilitates the use of new materials for patterned layers, such as platinum, iridium, iridium oxide, ruthenium and ruthenium oxide, that are known in the art to be difficult or impossible to etch by conventional processes.

The processes of the present invention are particularly useful in flexible electronics applications. In such applications, plastics are typically used as a substrate or with other features. It is often preferred to deposit a layer of some metal or metal oxide over such plastics, for example, to act as a barrier layer from contaminants. Plastics, as well as other organic substrates, are finding wide use as substrates in a number of emerging technologies, including, for example, organic light-emitting diodes ("OLEDs"). High-brightness OLEDs are of great interest to the flat-panel display industry, among others. The flat-panel display industry, among others, currently utilizes conventional processes to form thin metal and metal oxide films in their products. However, conventional deposition methods can be harmful to the organic matter, such as plastic substrates, due to the relatively high process temperature of conventional processes. In such applications, a relatively low temperature approach, such as the use of a photochemical metal organic deposition process (PMOD™) is preferable to avoid damaging the organic material used in such applications because the PMOD™ approach uses relatively low temperatures, such as ambient temperatures, in the deposition of metal and metal oxide films. Currently, sol-gel approaches may be used to avoid the damage caused by the temperatures of conventional deposition processes. However, sol-gel deposition processes result in a high carbon residue that could impair the effectiveness of such devices. Accordingly, a process to deposit metal and/or metal oxide layers on organic substrates, is needed. The present PMOD™ process can be used to deposit a metal or metal oxide layer on temperature sensitive materials without suffering the high carbon residues of sol-gel and CVD processes. Accordingly, the PMOD™ approach is an effective solution for flexible applications and applications using organic (e.g., plastic) materials.

In addition, the use of OLED technology in flat panel displays, and other information display formats, is currently limited by the poor environmental stability of the devices, see U.S. Pat. No. 6,268,695 to Affinito. Because of this poor environmental stability, devices are currently fabricated on glass substrates and have glass covers laminated over the top as an environmental barrier. Thus, even though the active portions of the device are of a lightweight, thin film, flexible polymer construction, the finished part is heavy and rigid because of the glass sheets needed as environmental barriers to protect the device from contact by permeation of oxygen and/or water vapor. Accordingly, the PMOD™ approach is an effective solution for providing a lightweight and flexible alternative for such applications.

SUMMARY OF THE INVENTION

One embodiment of the present invention is a method of depositing metal and metal oxide layers in applications where organic materials, such as plastics, are used. One such application, for example, is in the manufacture of OLED displays, in particular, flexible displays, using the low-cost PMOD™ methodology employing direct photoconversion of metal-organic precursor thin films. The PMOD™ methodology can be used in that application, for example, to deposit barrier layers on plastic substrates at low temperatures. In addition to the ability to deposit a variety of material at a low temperature, the PMOD™ methodology permits direct photopatterning while resulting in low levels of residual carbon relative to CVD and sol-gel processes. Metals, metal oxides and silicates that are deposited are amorphous, which is an important material property for certain applications.

Another embodiment of the present invention is a method of forming a hard mask on a substrate comprising the steps of:

selecting at least one precursor material;

forming a layer comprising the precursor atop a substrate;

converting at least a portion of the precursor layer;

developing the precursor layer thereby forming a pattern in the precursor layer; and transferring the pattern to the substrate, whereby a photoresist is not used in forming the pattern.

The unconverted portion of the precursor layer can be developed away an with a developer. Alternatively, the converted portion of the precursor layer can be developed away an with a developer. The developer can be a liquid developer comprising at least one alcohol and at least one ketone, wherein the total volume of all of the alcohols present is greater than 50% of the sum of the volumes of all of the alcohols present plus the volumes of all of the ketones present in the liquid developer. Preferably, at least one alcohol of the developer is isopropyl alcohol, the at least one ketone is methyl isobutyl ketone, and the ratio of isopropyl alcohol:methyl isobutyl ketone is from greater than about 1:1 by volume to less than about 40:1 by volume.

Another embodiment of the present invention is a method of forming a hard mask on a substrate, comprising the steps of:

selecting at least one precursor material;

optionally, forming a protective layer atop a substrate;

forming a layer comprising the unconverted precursor atop the protective layer;

converting at least a portion of the unconverted precursor layer;

substantially removing at least a portion of the unconverted precursor layer to form a patterned hard mask.

Conversion can be accomplished with an energy source selected from light, electron beam irradiation, ion beam irradiation, and mixtures thereof through a patterned mask comprising at least one portion substantially transparent to the energy source. At least a portion of the unconverted precursor layer can be substantially removed by using a developer.

An alternate embodiment of the present invention is a method of forming an etched pattern in a substrate, comprising the steps of:

selecting at least one precursor material;

forming a layer comprising the unconverted precursor atop a substrate;

converting at least a portion of the unconverted precursor layer;

substantially removing at least a portion of the unconverted precursor layer, thereby forming a patterned hard mask; and forming at least one patterned region in the substrate by etching at least a portion of the substrate substantially uncovered by the hard mask.

Another embodiment of the present invention is a method of forming an implanted region in a substrate, comprising the steps of:

selecting at least one precursor material;

optionally, forming a protective layer atop the substrate;

forming a layer comprising the at least one unconverted precursor material atop the protective layer;

converting at least a portion of the precursor layer;

substantially removing at least a portion of the unconverted precursor layer by using a developer to form a patterned hard mask; and forming at least one implanted region in the substrate by implanting ions in at least a portion of the substrate substantially uncovered by the hard mask.

Conversion can be accomplished with an energy source selected from light, electron beam irradiation, ion beam irradiation, and mixtures thereof. Ions can be implanted by exposing the uncovered substrate to an ion beam.

A further embodiment of the present invention is a method of forming a dual damascene architecture in a dielectric layer, comprising the steps of:

selecting at least one precursor material;

forming the dielectric layer with a characteristic thickness atop a substrate;

forming a layer comprising a first unconverted precursor atop the dielectric layer;

forming a converted portion of the first precursor layer by using a first converting means on at least a portion of the unconverted first precursor layer;

substantially removing at least a portion of the first unconverted precursor layer to expose at least a portion of the dielectric layer by using a first removing means to form a first pattern uncovered by the converted first precursor layer, thereby forming a first hard mask;

forming a spin planarization layer atop the exposed portion of the dielectric layer and atop the converted first precursor layer;

forming a layer comprising a second unconverted precursor atop the spin planarization layer;

forming a converted portion of the second precursor layer by using a second converting means on at least a portion of the unconverted second precursor layer;

substantially removing at least a portion of the second unconverted precursor layer to expose at least a portion of the spin planarization layer by using a second removing means to form a second pattern uncovered by the converted second precursor layer, thereby forming a second hard mask;

forming at least one second patterned region in the dielectric layer by using a first etching means on at least a portion of the dielectric layer and its overlying spin planarization layer substantially uncovered by the second hard mask such that less than the thickness of the dielectric layer in depth is removed by the first etching means;

substantially removing the remaining converted second precursor layer and spin planarization layer by using a third removing means, thereby exposing the converted first precursor layer;

forming at least one first patterned region in the dielectric layer by using a second etching means on at least a portion of the dielectric layer substantially uncovered by the first hard mask such that less than the thickness in depth of the dielectric layer is removed by the second etching means in the first patterned region and that substantially the entire thickness of the dielectric layer in depth is removed by the second etching means in the second patterned region, thereby uncovering at least a portion of the substrate; and optionally, substantially removing the remaining converted first precursor layer by using a fourth removing means.

Preferably, the dielectric layer is a low-dielectric constant dielectric material. Preferably, at least one of the first and second etching means is an anisotropic plasma comprising oxygen.

In each embodiment of the invention, a preferred precursor material is a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

BRIEF DESCRIPTION OF THE DRAWINGS

FIG. 11 illustrates a method for dual damascene process integration according to the present invention comprising fewer steps than FIG. 10.

DETAILED DESCRIPTION OF THE INVENTION

The present process allows for advantages unavailable with other film deposition and formation methods. As a result, it presents the user with a greater ability to control and manipulate the characteristics of the resulting film to suit the desired application. Therefore, the present process is useful in a broad spectrum of applications.

This invention provides a process for making a patterned film of desired materials. It is important to recognize that amorphous films are distinct from polycrystalline and crystalline films; further, while amorphous films are distinct from more ordered films, in addition, different amorphous films formed by different film-forming methods are different from one another. Further still, the different properties of different amorphous films formed by different methods can be controlled and engender specific chemical, physical and mechanical properties that are useful in particular applications, for example, as a layer(s) in a semiconductor device and/or in their fabrication. The hard masks formed by the present processes which comprise a step of at least partially converting such amorphous films are preferably patterned and are therefore useful for transferring a pattern to a substrate. Hard masks include but are not limited to implantation masks, etch masks, and pattern transfer layers or masks, e.g., liftoff masks.

Figure 1:
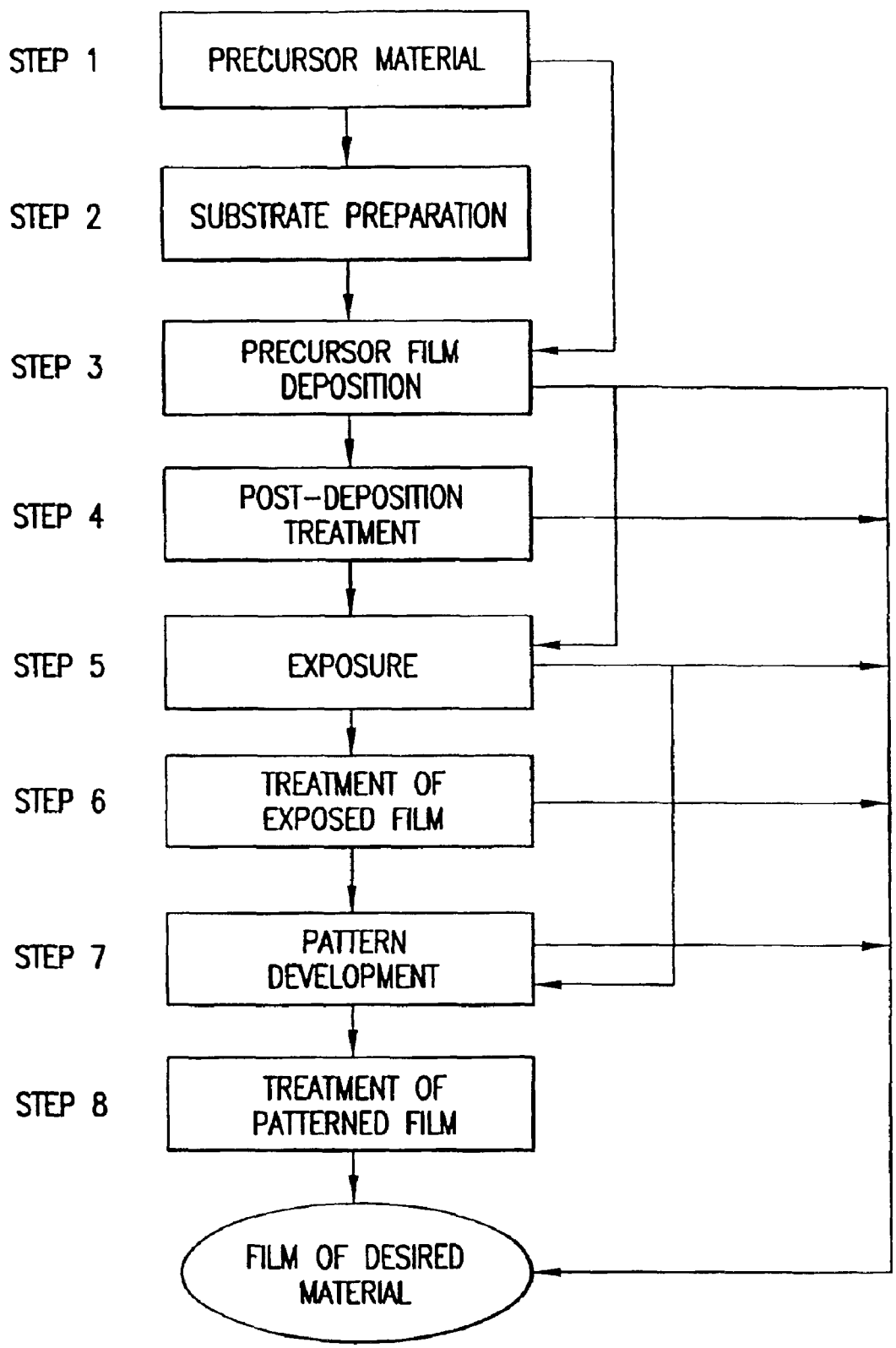
FIG. 1 is a process flow diagram which identifies process variables by process step.
Figure 2A:
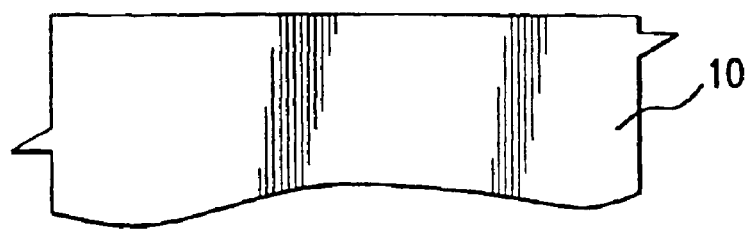
FIG. 2 illustrates the basic sequence of steps in an embodiment of the process of the present invention.
Figure 2B:
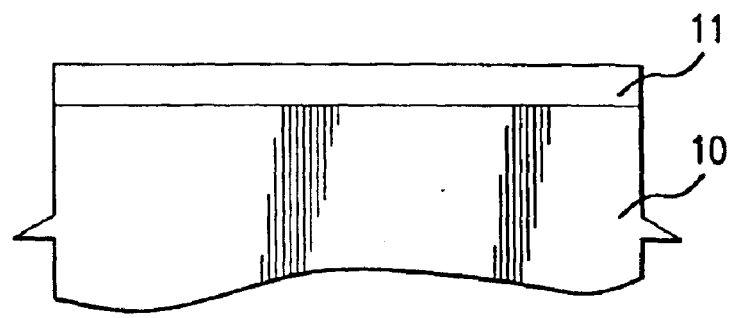
Figure 2C:
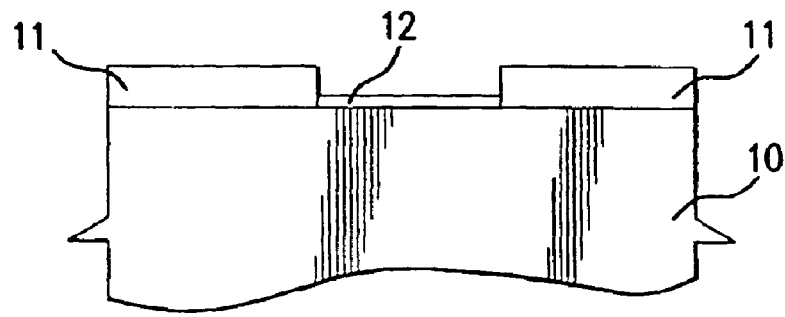
Figure 2D:
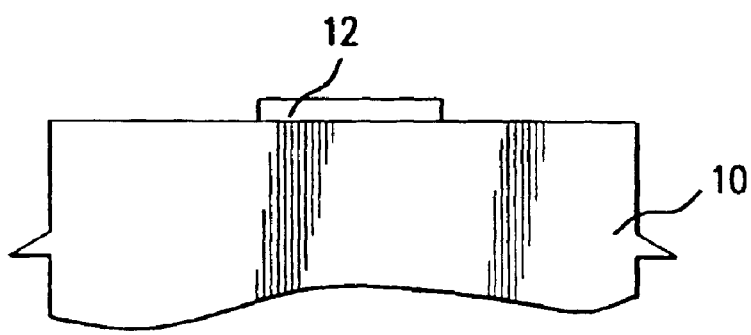
Figure 3D:
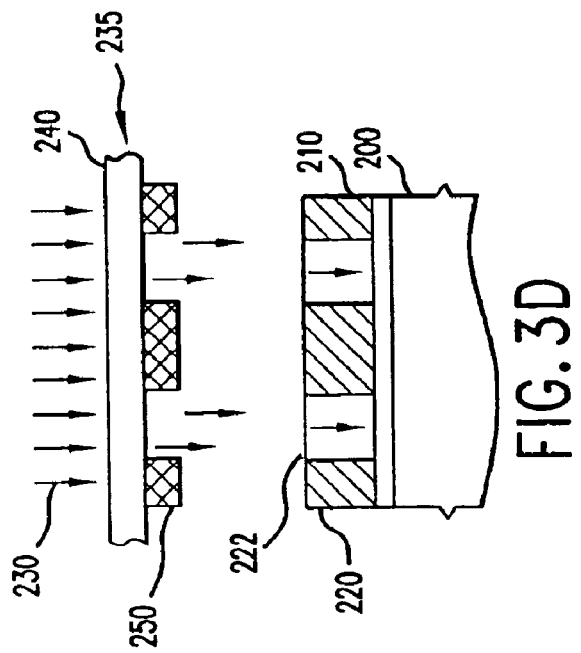
FIG. 3 illustrates a prior art method of fabrication and use of a hard mask used in semiconductor interconnect.
Figure 3A:
Figure 3B:
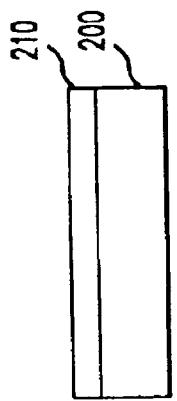
Figure 3C:
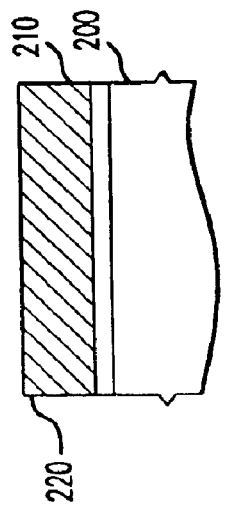
Figure 3E:
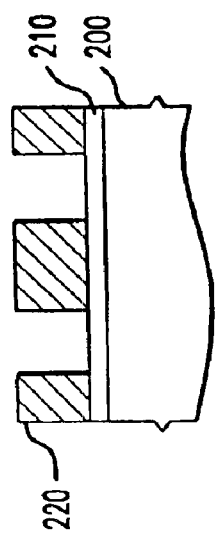
Figure 3G:
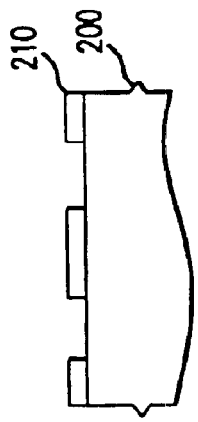
Figure 3H:
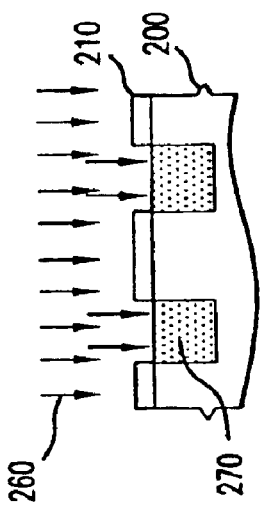
Figure 3I:
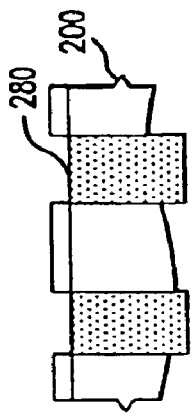
Figure 3F:
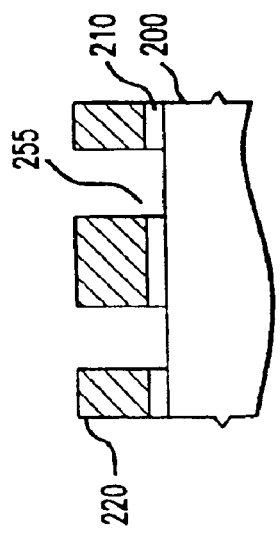

One advantage of an embodiment of the present process is that it yields a patterned electronic material without using a conventional patterning material, i.e., a photoresist, in forming the pattern. Another advantage of the present process is that the amorphous films of precursor material which may be formed may optionally be directly patterned on a substrate, without the use of intermediate patterning materials. As a result of an understanding of process variables, important and unique properties are attainable though this deposition process that are not by the use of other film deposition and formation methods. FIG. 1 provides an overview of the present process by a process flow diagram showing exemplary steps that may be followed to obtain a film of the desired material with optimized properties for a particular application. Many of these steps are fully optional, based on the ultimate application of the film. The present invention is also not limited to these steps and may include other steps, based on the ultimate application of the film. One skilled in the art will know which steps should be included or excluded to achieve the desired result for the particular application.

At each step, variables exist that may be manipulated to affect the resulting film. For example, at step 1 of FIG. 1, the variables may include the composition of the precursor material, the solvent used in the precursor material, whether a solvent is used in the precursor material, the additives that may be used with the precursor material, and/or rate enhancers that may be included with the precursor material.

At step 2 of FIG. 1, the variables may include cleaning the substrate, the deposition of a barrier layer, the deposition of an adhesion promoter, and/or the use of a reactive layer.

At step 3 of FIG. 1, the variables may include the method of applying the precursor film, the atmosphere in which the precursor is applied, and/or the temperature of the deposition.

At step 4 of FIG. 1, the variables may include a thermal treatment, treatment with an electron beam, treatment with an ion beam, treatment using microwaves, and/or the use of a particular atmosphere.

At step 5 of FIG. 1, the variables may include whether the film is blanket exposed or patterned or a blend of each and/or the use of a particular atmosphere.

At step 6 of FIG. 1, the variables may include a thermal anneal, treatment using microwaves, treatment with an electron beam, treatment with an ion beam, plating, and/or the use of a particular atmosphere.

At step 7 of FIG. 1, the variables may include patterning with either wet or dry techniques.

At step 8 of FIG. 1, the variables may include annealing and/or the use of a particular atmosphere. Also, at this step, any amorphous film formed may be converted to polycrystalline or crystalline films, e.g., by the application of elevated temperatures or various other nucleation processes, such as photo-induced nucleation, and that for some applications this may be a desirable process step.

These variables are intended as examples and are not to be considered exhaustive lists of the variables that may be manipulated to affect the properties of the resulting film. More specific aspects and embodiments of the present invention are described in detail below.

Where a patterned film is desired, the process described here may proceed photochemically, without the use of an intermediate patterning material, e.g., a photoresist, and may be undertaken under ambient conditions, or may be undertaken under other conditions such as either an air or other composition atmosphere and/or under a variety of pressures, e.g., ambient, higher or lower than ambient, and may be used in conjunction with, a variety of other processing steps to yield unique materials, layers and structures.

Where the process is performed photolytically, the process proceeds at substantially ambient temperatures while other prior art methods require the use of elevated temperatures to effect pattern transfer, often greater than 100° C. This limitation confers severe processing constraints from a manufacturing standpoint and limits the choice of materials used in the assembly of devices associated with the applications of the method.

The process of the present invention usually proceeds satisfactorily under substantially ambient pressure. In contrast, many of the prior art deposition methods, in addition to having the aforementioned limitations, must be undertaken under conditions of high vacuum, invoking the necessity for expensive and complicated equipment that is difficult to run and maintain.

The processes of the present invention facilitate the formation of a thin layer on a substrate from a precursor material. The precursor comprises molecules specifically designed for their ability to coat the substrate in a uniform manner, resulting in films of high optical quality, and, in the case of the present process, for photosensitivity. The identity of the precursor molecule is a significant variable—a wide variety of metal complexes of the formula $M_aL_b$ comprising at least one metal ("M"), i.e., a is an integer which is at least 1, and at least one suitable ligand ("L") or ligands, i.e., b is an integer which is at least 1, are envisioned by this invention.

If a plurality of metals are used, all of the metal atoms may be identical, all may be different atoms and/or have different valences, e.g., Ba Na or Fe(II) Fe(III), or some may be identical while others may be different atoms and/or have different valences, e.g., $Ba_2$ Fe(II) Fe(III). In any case, metal M may be an alkali or alkaline earth, for example Ba or Li, a transition metal, for example Cr or Ni, a main group metal, for example Al or Sn, or an actinide, for example U or Th. Preferably, each metal is independently selected from Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, and Mg.

If a plurality of ligands are used, all of the ligands may be identical, all may be different, or some may be identical while others may be different. In any case, ligand L is chosen so that a substantially unconverted precursor complex can be formed and has the properties that:

1) it can be deposited in an amorphous film on a substrate, 2) the amorphous film is stable or, at least, metastable, 3) upon absorbing energy, e.g., a photon of the required energy, the film can be transformed into a different metal-containing material through a chemical reaction, and 4) any byproducts of the energy-induced chemical reaction should be removable, i.e., should be sufficiently volatile so as to be removable from the film.

To achieve the first two of these results, the complex should have a low polarity and low intermolecular forces. As organic groups usually have low intermolecular forces, ligands having organic groups at their outer peripheries tend to be satisfactory with respect to the first two requirements. If the energy absorbed is light, the chemical reaction of step (3) is known as a photo-induced reaction.

The deposited film of substantially unconverted precursor is amorphous or at least substantially amorphous. Therefore, to make the metal complex resistant to crystallization, ligand(s) L preferably are such that the complex is asymmetric. The complex may be made asymmetric by using a ligand which itself has two or more stereoisomeric forms. For example, if L is racemic 2-ethylhexanoate, the resulting metal complex is asymmetric because the complex has several different stereoisomeric forms. The size and shapes of organic portions of the ligands may be selected to optimize film stability and to adjust the thickness of film that will be deposited by the selected film deposition process.

The stability of an amorphous film with respect to crystallization may also be enhanced by making the film of a complex which has several different ligands attached to each metal atom. Such metal complexes have several isomeric forms. For example, the reaction of $CH_3HNCH_2CH_2NHCH_3$ with a mixture of a nickel(II) salt and KNCS leads to the production of a mixture of isomers. The chemical properties of the different isomers are known not to differ significantly, however, the presence of several isomers in the film impairs crystallization of the complex in the film.

The complex must also be stable, or at least metastable, in the sense that it will not rapidly and spontaneously decompose under process conditions. The stability of complexes of a given metal may depend, for example, upon the oxidation state of the metal in the complex. For instance, Ni(0) complexes are known to be unstable in air while Ni(II) complexes are air-stable. Consequently, a process for depositing Ni based films which includes processing steps in an air atmosphere should include a Ni(II) complex in preference to a Ni(0) complex.

Partial conversion and conversion result from a chemical reaction within the film which changes the partially converted or converted regions into a desired converted material. Ideally, at least one ligand should be reactive and be attached to the complex by a bond which is cleaved when the complex is raised to an excited state by the influence of the partial converting means and/or the converting means. Preferably the reactive group is severed from the complex in a photochemical reaction initiated by light, more preferably, by ultraviolet light, as the partial converting means and/or the converting means. To make such photochemical step(s) in the process efficient, it is highly preferable that the intermediate product produced when the reactive group is severed be unstable and spontaneously convert to the desired new material and volatile byproduct(s).

There are several mechanisms by which a suitable photochemical reaction may occur. Some examples of suitable reaction mechanisms which may be operable, individually or in combination, according to the invention are as follows: (a) absorption of a photon may place the complex in a ligand to metal charge transfer excited state in which a metal-to-ligand bond in the metal complex is unstable, the bond breaks and the remaining parts of the complex spontaneously decompose, (b) absorption of a photon may place the complex in a metal-to-ligand charge transfer excited state in which a metal-to-ligand bond in the complex is unstable, the bond breaks and the remaining parts of the complex spontaneously decompose, (c) absorption of a photon may place the complex in a d-d excited state in which a metal-to-ligand bond in the complex is unstable, the bond breaks and the remaining parts of the complex spontaneously decompose, (d) absorption of a photon may place the complex in an intramolecular charge transfer excited state in which a metal-to-ligand bond in the complex is unstable, the bond breaks and the remaining parts of the complex spontaneously decompose, (e) absorption of a photon may place at least one ligand of the complex in a localized ligand excited state, a bond between the excited ligand and the complex is unstable, the bond breaks and the remaining parts of the complex spontaneously decompose, (f) absorption of a photon may place the complex in an intramolecular charge transfer excited state such that at least one ligand of the complex is unstable and decomposes, then the remaining parts of the complex are unstable and spontaneously decompose, (g) absorption of a photon may place at least one ligand of the complex in a localized ligand excited state wherein the excited ligand is unstable and decomposes, then the remaining parts of the complex are unstable and spontaneously decompose, and (h) absorption of a photon may place the complex in a metal-to-ligand charge transfer excited state in which at least one ligand of the complex is unstable and decomposes, then the remaining parts of the complex are unstable and spontaneously decompose. In its broad aspects, however, this invention is not to be construed to be limited to these reaction mechanisms.

Exemplary metal complexes, and their metal and ligand components, are described in U.S. Pat. No. 5,534,312 which is incorporated herein by reference in its entirety. Preferred metal complex precursors include ligands which meet the above criteria. More preferably, the ligands are selected from the group consisting of acetylacetonate (also known as "acac" or 2,4-pentanedione) and its anions, substituted acetylacetonate, i.e.,

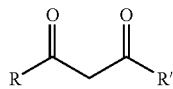

and their anions, acetonylacetone (also known as 2,5-hexanedione) and its anions, substituted acetonylacetone, i.e.,

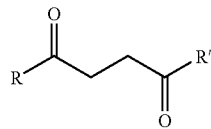

and its anions, dialkyldithiocarbamates, i.e.,

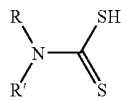

and its anions, carboxylic acids, i.e.,

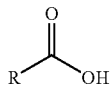

such as hexanoic acid where R=$CH_3(CH_2)_4$, carboxylates, i.e.,

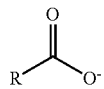

such as hexanoate where R=$CH_3(CH_2)_4$, pyridine and/or substituted pyridines, i.e.,

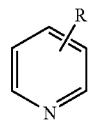

azide, i.e., $N_3^-$, amines, e.g., $RNH_2$, diamines, e.g., $H_2NRNH_2$, arsines, i.e.,

diarsines, i.e.,

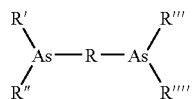

phosphines, i.e.,

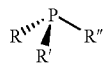

diphosphines, i.e.,

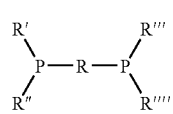

arenes, i.e.,

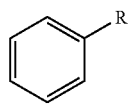

hydroxy, i.e., $OH^-$, alkoxy ligands, e.g., $RO^-$, ligands such as $(C_2H_5)_2NCH_2CH_2O-$, alkyl ligands, e.g., $R^-$, aryl ligands, and mixtures thereof; where each R, R', R", R''', and R'''' is independently selected from organic groups and, preferably, is independently selected from alkyl, alkenyl, aralkyl and aralkenyl groups.

As used herein, the term "alkyl" refers to a straight or branched hydrocarbon chain. As used herein, the phrase straight chain or branched chain hydrocarbon chain means any substituted or unsubstituted acyclic carbon-containing compounds, including alkanes, alkenes and alkynes. Examples of alkyl groups include lower alkyl, for example, methyl, ethyl, n-propyl, iso-propyl, n-butyl, iso-butyl, tert-butyl or iso-hexyl; upper alkyl, for example, n-heptyl, -octyl, iso-octyl, nonyl, decyl, and the like; lower alkylene, for example, ethylene, propylene, propylyne, butylene, butadiene, pentene, n-hexene or iso-hexene; and upper alkylene, for example, n-heptene, n-octene, iso-octene, nonene, decene and the like. The ordinary skilled artisan is familiar with numerous straight, i.e., linear, and branched alkyl groups, which are within the scope of the present invention. In addition, such alkyl groups may also contain various substituents in which one or more hydrogen atoms is replaced by a functional group or an in-chain functional group.

As used herein, the term "alkenyl" refers to a straight or branched hydrocarbon chain where at least one of the carbon-carbon linkages is a carbon-carbon double bond. As used herein, the term "aralkyl" refers to an alkyl group which is terminally substituted with at least one aryl group, e.g., benzyl. As used herein, the term "aralkenyl" refers to an alkenyl group which is terminally substituted with at least one aryl group. As used herein, the term "aryl" refers to a hydrocarbon ring bearing a system of conjugated double bonds, often comprising at least six π (pi) electrons. Examples of aryl groups include, but are not limited to, phenyl, naphthyl, anisyl, toluyl, xylenyl and the like.

The term "functional group" in the context of the present invention broadly refers to a moiety possessing in-chain, pendant and/or terminal functionality, as understood by those persons of ordinary skill in the relevant art. As examples of in-chain functional groups may be mentioned ethers, esters, amides, urethanes and their thio-derivatives, i.e., where at least one oxygen atom is replaced by a sulfur atom. As examples of pendant and/or terminal functional groups may be mentioned halogens, such as fluorine and chlorine, and hydrogen-containing groups such as hydroxyl, amino, carboxyl, thio and amido, isocyanato, cyano, epoxy, and ethylenically unsaturated groups such as allyl, acryloyl and methacryloyl, and maleate and maleimido.

To enhance the desired photochemical characteristics, including the tendency of the products of the photochemical reaction to spontaneously thermally decompose, ligands comprising and/or selected from one or more of the following groups may be used alone or in combination with the above-ligands: oxo, i.e., $O_2^-$
oxalato, i.e.,

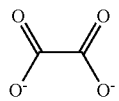

2- halide, hydrogen, hydride, i.e., $H^-$, dihydride, i.e., $H_2$, hydroxy, cyano, i.e., $CN^-$, carbonyl, nitro, i.e., $NO_2$, nitrito, i.e., $NO_2^-$, nitrate, i.e, $NO_3$, nitrato, i.e., $NO_3^-$, nitrosyl, i.e., NO, ethylene, acetylenes, i.e., R≡R' thiocyanato, i.e., SCN—, isothiocyanato, i.e., $NCS^-$, aquo, i.e., $H_2O$, azides, carbonato, i.e., $CO_3^{-2}$, amine, and thiocarbonyl, where each R and R' is independently selected from organic groups and, preferably, is independently selected from alkyl, alkenyl, aralkyl and aralkenyl groups. Even more preferably, each ligand is independently selected from acac, carboxylates, alkoxy, oxalato, azide, carbonyl, nitro, nitrato, amine, halogen and their anions.

Preferably, the metal complex precursor is selected from those comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

The precursor may be applied to the substrate directly. Alternatively and preferably, the precursor is dissolved in a solvent or solvents to form a precursor solution. This facilitates its application to the substrate by a variety of means well known to those of ordinary skill in the art, such as by spin or spray application of the solution to the substrate. The solvent may be chosen based on several criteria, individually or in combination, including the ability of the solvent to dissolve the precursor, the inertness of the solvent relative to the precursor, the viscosity of the solvent, the solubility of oxygen or other ambient or other gases in the solvent, the UV, visible, and/or infra-red absorption spectra of the solvent, the absorption cross-section of the solvent with respect to electron and/or ion beams, the volatility of the solvent, the ability of the solvent to diffuse through a subsequently formed film, the purity of the solvent with respect to the presence of different solvent isomers, the purity of the solvent with respect to the presence of metal ions, the thermal stability of the solvent, the ability of the solvent to influence defect or nucleation sites in a subsequently formed film, and environmental considerations concerning the solvent. Exemplary solvents include the alkanes, such as hexanes, the ketones, such as methyl isobutyl ketone ("MIBK") and methyl ethyl ketone ("MEK"), and propylene glycol monomethyl ether acetate ("PGMEA").

The concentration of the precursor in the solution may be varied over a wide range and may be chosen by one of ordinary skill in the art with, at most, minimal routine experimentation, such that the properties of the precursor film, including its thickness and/or sensitivity to irradiation by light or particle beams, are appropriate for the desired application.

However, the choice of precursor may have a significant influence on the properties of the desired film which is not readily predictable by one skilled in the art. For example, two precursors ML and ML', each consisting of metal M and one of two different ligand sets L or L', might be expected to form films of the desired material which are identical because, e.g., the portions of the ligands which differ from each other would be removed during conversion of the precursor into a hard mask. In fact, the supposedly identical film products of these two similar reactants may differ significantly in their properties. Examples of properties which may be affected in this process include the dielectric constant and the presence/absence of any secondary or tertiary structure in the film. Possible reasons for this difference may relate to the rate of formation of the amorphous material and the ability of the photo-ejected ligand to remove energy from the photo-produced film of desired material. The presence of ligand fragments during an exposure process may also affect the film forming process, influencing such phenomena as diffusion properties of the film, nucleation, and crystal growth.

Further, the choice of the precursor in film formation and photochemical exposure can substantially influence further reactivity of the film of the desired material with, for example, gaseous constituents of the atmosphere in which the desired film is formed. This could influence, for example, the rate of oxidation of the deposited film where either a high or low rate could be an advantage depending upon the desired product. Additionally, it is recognized that the effect of the precursor upon the healing ability of the film, i.e., its ability to minimize crazing, and the shrinkage or densification of the film may be substantially influenced by the choice of precursors that would otherwise be seen to yield identical results by one skilled in the art.

Chemical additives are optionally present with the precursor or in the precursor solution. These may be present for any or several of the following reasons: to control the photosensitivity of a subsequently deposited precursor or film, to aid in the ability to deposit uniform, defect-free films onto a substrate, to modify the viscosity of the solution, to enhance the rate of film formation, to aid in preventing film cracking during subsequent exposure of the deposited film, to modify other bulk properties of the solution, and to modify in important ways the properties of the film of the desired material. The additives are chosen on these criteria in addition to those criteria employed when choosing a suitable solvent. It is preferable that the precursor or the precursor solution be substantially free of particulate contamination so as to enhance its film-forming properties.

The nature of the substrate to which the precursor is applied is not critical for the process although it may effect the method of deposition of the precursor film and the solvent for the deposition, if one is used. Substrates may include but are not limited to simple salts, such as $CaF_2$, semiconductor surfaces, including silicon, compound semiconductors, including silicon germanium and III–V and II–VI semiconductors, printed and/or laminated circuit board substrates, metals, ceramics, and glasses. Silicon wafers, ceramic substrates and printed circuit boards have been used extensively. Prior to its use in the present process, the substrate may have been coated with single or multiple layers, such as dielectric layers, photoresist, polyimide, metal oxides, thermal oxides, conductive materials, insulating materials, ferroelectric materials or other materials used in the construction of electronic devices. In cases where patterning is to be effected by an oxygen plasma, and the precursor material is to be employed as a TSI agent, the underlying layer is likely to be organic in nature, including but not limited to Novolac resin, poly(methyl methacrylate) ("PMMA"), poly(methyl glutarimide) ("PMGI"), polyimide, and poly(p-hydroxystyrene) ("PHOST").

To the extent that metal atoms in the hard mask, once formed, might be "bumped" into the underlying substrate during a subsequent step, this can be overcome by careful selection of precursor formulation conditions and/or thickness. Alternatively, an optional protective layer can be used between the substrate and the precursor layer which remains to protect the substrate after the hard mask forming process is completed. Optionally, the substrate may be coated with at least one protective layer before the precursor or precursor solution is applied. The protective layer may be applied to the substrate by a variety of means well known to those of ordinary skill in the art. Protective layers are particularly desirable when the process includes an ion implantation step.

The preparation of the substrate prior to deposition of the precursor film can have a significant impact on the ultimate nature of the desired hard mask. Thus, certain surface preparations may be desirable or, conversely, may need to be avoided depending upon the particular hard mask used. Substrate preparations may include a simple cleaning process to remove unwanted species from the substrate surface, a prior patterning step, the deposition of a barrier material, the deposition of an adhesion promoting material, or the deposition of a reactive material designed to induce chemical change in the film of deposited material, e.g., a coupling agent.

The method of application of the precursor or the precursor solution may be chosen depending on the substrate and the intended application. Some examples of useful coating methods well known to those of ordinary skill in the art include spin, spray, dip and roller coating, stamping, meniscus, and various inking approaches, e.g., inkjet-type approaches. Variables in the coating process may be chosen in order to control the thickness and uniformity of the deposited film, to minimize edge effects and the formation of voids or pinholes in the film, and to ensure that no more than the required volume of precursor or precursor solution is consumed during the coating process. Optimized application of the precursor film may desirably yield very smooth films.

The deposited film may, optionally, be subjected to a baking or vacuum step where any residual solvent present in the deposited film may be driven off. If a baking step is employed, it is, of course, important to keep the temperature of this step below the temperature at which the precursor molecules decompose thermolytically. The process of the invention allows for blanket thermal or heat treatment or annealing of the precursor cast film so as to convert it thermolytically into a blanket uniform coating of the desired material, or to a film that requires a lower partial converting means and/or converting means dose for patterning than would have been possible without the thermal treatment. The deposited film may optionally be subjected to other treatments at this stage of the process, including but not limited to blanket photochemical or electron beam exposure and microwave treatment.

It is recognized that a bake step at this stage of the process may contribute to ejecting solvent from the precursor film and also initiate a thermal decomposition process. Both of these mechanisms may aid in the overall efficiency of the process resulting in, for example, a lower dose requirement during a subsequent partial converting and/or converting step. It is further recognized that during such a bake step, a new material, different from either the deposited film or the film of the desired material, may be formed. The effect of this could alter significantly subsequent properties of the desired material, including dielectric constant, nucleation, speciation, and crystallization behavior in ways that are not readily predicted by one skilled in the art. For example, a two component system in which one material is activated in the pre-bake step while the other component(s) is selected to be activated in either a photochemical or higher energy thermal process step may be preferred in certain applications. This deposition, from a mixture of precursors, would permit the efficient design of a system to take advantage of the different chemical properties of materials formed from the bake and subsequent partial converting and/or converting step(s).

The deposited film is next subjected to a partial converting means and/or converting means, i.e., a source of energy, such that the precursor is at least partially converted. The entire film, or selected regions of the deposited precursor film, may be exposed to a source of energy. The energy source may be, e.g., a light source of a specific wavelength, a coherent light source of a specific wavelength or wavelengths, a broadband light source, an electron beam ("e-beam") source, or an ion beam source. Light in the wavelength range of from about 150 to about 600 nm is suitably used. Preferably, the wavelength of the light is from about 157 to about 436 nm.

In certain embodiments of the invention, the energy source is a light source directed through an optical mask used to define an image on the surface. The mask consists of substantially transparent and substantially opaque or light absorbing regions. The mask may also include an optical enhancing feature such as a phase shift technology. However, the energy source need not be directed through a mask. For example, if it is not necessary to pattern the material, a flood or blanket energy exposure may be used, such as is provided by thermal energy or a wide beam of light.

The atmosphere and pressure, both total and partial, under which the deposited film is at least partially converted may be important process variables. Normally, it is convenient and economical for the atmosphere to be air but it may be preferable to change the composition of the atmosphere present during at least partial conversion. One reason for this is to increase the transmission of the exposing light, if short wavelength light is used, because such light may be attenuated by air. Thus, by varying the intensity of the light, e.g., increasing it, it is possible to initiate thermal reaction within the films to generate product films. It may also be desirable to change the composition of the atmosphere to alter the composition or properties of the product film. For example, the exposure of a copper complex results in the formation of a copper oxide in air or oxygen atmospheres. By virtually eliminating oxygen from the atmosphere, a film comprising primarily reduced copper species may be formed. For example, a partial conversion or conversion step is preferably performed in the presence of oxygen if the converted precursor is to be a dielectric film or in the presence of a reducing gas, such as hydrogen, if the converted precursor is to be a metallic film. Additionally, the amount of water in the film may be changed by changing the humidity of the atmosphere.

The use of a partial conversion step, or different conversion steps in sequence, also known as "substrate pretreatment", may be advantageous from a process flow standpoint, for example, in order to minimize the time during which a precursor atop a substrate needs to be exposed in an expensive piece of equipment, such as a stepper.

Following at least partial conversion of the deposited precursor, the precursor film may, optionally, be treated by any of a variety of methods well known to the art prior to removing at least a portion of the unconverted precursor layer. These methods include but are not limited to annealing treatments, such as thermal, laser or plasma annealing steps, exposure to a specific atmosphere, e.g., oxidizing or reducing, ion implantation, microwave treatment and electron beam treatment. If the at least partial converted area(s) may serve as electroless plating nucleation sites relative to the unconverted area(s) of the precursor, then an optional plating step may be used at this stage.

Unexposed regions of the deposited film, or a portion thereof, may then be removed by the application of a removing (or developing) means. For example, a developing means may comprise a developer composition that may be applied as a liquid or a solution in a puddle development or immersion wet development process. Alternately, a dry development process analogous to dry patterning steps conventionally employed by the semiconductor industry may be employed as a developing means. Preferred removal means include spray development, puddle development, and immersion wet development.

The developer should be formulated and/or used under conditions such that a solubility difference exists between exposed and unexposed regions of the film. This solubility difference is used to remove preferentially select regions of the film such that certain chosen regions of the film are substantially removed by the developer while regions desired to remain on the substrate are left substantially intact. Considerable experimentation may be required to optimize the formulation of the developer. For example, in a process in which regions that have been exposed to incident energy are desired to remain on the substrate, use of the casting solvent to develop the film after exposure to incident radiation is too aggressive. A dilute solution of the casting solvent in another liquid in which (a) the casting solvent is miscible, (b) unexposed regions of the film are sparingly (but not necessarily completely) soluble, and (c) exposed regions of the film are substantially insoluble, provides for an improved development process.

For instance, in one preferred embodiment of the invention an amorphous film may be cast from a ketone solution. Use of the ketone alone as a developer, or a ketone-rich mixture of alcohol and the ketone, i.e., a mixture with greater than 50 vol.% ketone, results in a development process that is less effective than when the alcohol is the majority component. For instance, 10:1 (vol/vol) IPA:MIBK solution is a more effective developer for $Ba_xSr_yTi_zO_3$ ("BST") than MIBK alone or 1:1 (vol/vol) IPA:MIBK, where "IPA" signifies isopropyl alcohol. The 10:1 mixture, in turn, is less effective than 20:1 IPA:MIBK. However, both of the 10:1 and 20:1 solutions are more effective than a solution of 40:1 (vol/vol) IPA:MIBK. Furthermore, the relative effectiveness of these solutions depends heavily on other processes employed in the formation of the patterned film including, for example, the type and energy of incident radiation and the temperature of the substrate during coating and patterning. Thus, the determination of an appropriate developer formulation for the present invention requires experimentation and is not obvious to one of ordinary skill in the art. Liquid and/or solution-based developers may be physically applied in a fashion analogous to development methods employed with photoresist-based processes, for example, those discussed above.

After development, the at least partially converted precursor may, optionally, be treated by any of a variety of methods well known to the art prior to its being subjected to a converting means. These methods include but are not limited to annealing treatments, such as thermal, laser or plasma annealing. The temperature and time of such annealing are important variables. The annealing step may also be influenced by prior surface treatments, for example, oxygen plasma, laser or a rapid thermal annealing ("RTA") process. It is possible to select appropriate conditions such that the annealed at least partially converted precursor retains its amorphous nature while at least one of its physical or electrical properties is desirably altered. Alternatively, annealing conditions that cause the film to convert to its crystalline state, e.g., a high temperature, may be desirable depending on the application for which the film is to be used. For example, appropriate thermal treatment at this stage may be employed to induce the formation of highly oriented crystalline films from the amorphous or at least substantially amorphous at least partially converted precursor. In this manner, the properties of the amorphous film may be finely tuned or its physical properties may even be varied over a wide range—from the completely amorphous phase at one extreme to semi-crystalline intermediate phases to a single oriented crystalline phase at the other extreme. Such thermal treatment will usually act to further convert the precursor.

If the precursor has yet to be substantially fully converted, the precursor film is next optionally but typically subjected to a converting means such that the precursor is substantially fully converted. The entire film or selected regions of the precursor film may be exposed to a source of energy. The converting means can be an energy source that may be the same as or different from any partial converting means previously employed. For example, the converting means may be a light source of a specific wavelength, a coherent light source of a specific wavelength, a broadband light source, an electron beam source, and/or an ion beam source. In certain embodiments of the invention, the energy source, or at least a portion of the energy source, is a light source directed through an optical mask used to define an image on the surface, as discussed above. However, the energy source need not be directed through a mask. For example, it may not be necessary to pattern the material during the conversion step, e.g., because the precursor may already be patterned, therefore, a flood or blanket exposure may be used as the converting means. Preferred converting means include light, electron beam, ion beam, and thermal treatment. As discussed above for partial conversion and as is also applicable here, the atmospheric conditions under which the deposited film is converted, such as atmosphere composition, pressure, both total and partial, and humidity, may be important process variables. During conversion, these variables may be the same as or different from their settings used in any preceding partial conversion step.

It is, of course, to be understood that, as a preferred thin film, e.g., hard mask, may be formed by substantially fully converting at least one portion of the partially converted precursor layer, the terms "substantially fully converted precursor", "fully converted precursor", "converted precursor", "substantially fully converted partially converted precursor", "fully converted partially converted precursor", and "converted partially converted precursor" as used herein all describe such a thin film.

It is recognized that during the process of partially converting and/or substantially fully converting the precursor film to the film of the desired material, that some shrinkage of the film may occur; that is, the thickness of the film of the desired material is often less than the thickness of the unconverted precursor film. This change in thickness is an important feature of the invention, conferring useful properties to the film of desired material. For example, the formation of extremely thin films is advantageous with respect to maximizing capacitance, while at the same time the formation of such thin films is challenging from a manufacturing standpoint. The process of the invention provides the capability to apply relatively thicker cast films, conferring greater manufacturing ease, but also provides relatively thinner films of the desired at least partially converted precursor material, conferring improved properties to the film of the desired material. The shrinkage properties of the deposited film may be controlled and tuned to target parameters by judicious manipulation of process variables including: the selection of the precursor, the selection and quantity of the solvent, the identity of precursor additives, the thickness of the precursor film as determined by the deposition process, the use of thermal treatments before, during and after the patterning of the film, and the development of the exposed film. The process of the invention allows for precise thickness control of desired films ranging in total thickness from the Angstrom range through the micrometer range.

After conversion, subsequent optional process steps may include post-conversion treatment, developing, including but not limited to the novel development method discussed above, and post-developing treatment steps. The specific steps chosen depend upon the ultimate use of the product. For example, methods of use are described in U.S. Pat. Nos. 5,534,312, 5,821,017 and 6,071,676, each of which is incorporated herein by reference in its entirety.

In certain embodiments of the present process, conversion is followed by an implantation step, where at least one implanted region is formed in the substrate by using an implantation means on at least a portion of the substrate substantially uncovered by the hard mask. The use of an ion beam as an implantation means is well known to the art. However, the present process is not limited to the use of ion beams; any effective method of implantation may be used. Ions suitable for implantation include but are not limited to arsenic, boron and phosphorous. Ion implantation may be conducted under conditions of high energy, i.e., greater than about 300 KeV, coupled with low dose, i.e., less than about $10^{20}$ atm/cm$^2$, or under conditions of low energy, i.e., less than about 300 KeV, coupled with high dose, i.e., greater than about $10^{20}$ atm/cm$^2$. Optionally, the hard mask layer may be removed after implantation. Optionally, the implanted substrate may be further treated, such as by annealing, thereby converting implanted substrate regions into doped regions. If both of these optional steps are performed, the order in which they are performed may be adjusted to suit the particular application to which the present invention is directed.

Other embodiments of the invention envision the at least partially converted precursor formed by the present process serving as an etch resist layer. In the etching step or steps, an etching means, such as plasma, reactive ion or wet etching solution, contacts selected areas of the substrate through the pattern provided by the hard mask, removing substrate in those desired areas only. Currently, conventionally-applied hard masks of materials such as silicon dioxide and silicon nitride are used as protective masks in electronics manufacturing processes employing etching.

In addition, the PMOD™ technology has several applications to flat panel display manufacturing. Examples of such applications are (a) matrix fabrication for pixel isolation in color PLED displays; (b) deposition for permanent resist-structures for cathode patterning in passive matrix OLED displays; (c) substrate barrier layer deposition for plastic and glass substrates; and (d) dielectric deposition for thin film transistor fabrication for active matrix displays.

The PMOD™ approach offers the advantage of direct thin film imaging in examples (a) and (b) and offers material benefits for examples (c) and (d) relating to flat panel display manufacturing.

Direct thin film imaging allows a reduction in process steps from conventional thin film imaging. In direct thin film imaging, a PMOD™ precursor film is deposited and acts as the pattern-transfer layer and hard mask. After deposition, for example, the PMOD™ precursor is exposed to UV light and developed to form a patterned PMOD™ metal/metal-oxide hard mask layer. The pattern-transfer layer may then be etched through the PMOD™ etch mask. In contrast, with conventional thin film imaging, a separate hard mask layer must be deposited with a photoresist layer deposited thereon. The photoresist layer is exposed to UV light to form a pattern to form a patterned hard mask. It is clear that the use of the PMOD™ process adds efficiency by eliminating process steps. Additionally, the PMOD™ approach may also avoid the formation of resist residues formed from etching photoresist and the problems associated with the formation of such residues. The material benefits include the ability to deposit metal and metal oxide barrier layers where low temperature processing is necessary (e.g., with plastic substrates) and a four-fold reduction in residual carbon levels from a conventional sol-gel process.

An embodiment of the present invention is a barrier layer deposited by the PMOD™ methodology. This approach is the direct photodeposition of a thin metal, metal oxide and/or silicate film as a hermetic barrier layer for organic substrates (e.g., plastic substrates) used in flat panel display applications. Deposition of a viable barrier layer for plastic displays is critical for the commercialization of displays on flexible substrates.

A barrier layer is critical to isolate the display devices from impurities present in the substrate and eliminate the permeability of environmental contaminants through the substrate (e.g., water and oxygen). The efficacy of the barrier layer is critical due to the sensitivity of the cathode metal and light emitting polymer materials to oxygen and water. Both OLED and LCD manufacturers suffer from the problem of effectively preventing contamination when fabricating displays on plastic substrates. The PMOD™ based deposition of metal oxides is an effective low-temperature alternative to CVD or sputter-deposited materials.

A typical organic light emitting device 1430 is shown in FIG. 1. Organic light emitting device 1430 comprises a substrate 1432. Substrate 1432 can be made from a variety of materials, including but not limited to, glass, quartz, and plastic. Anode 1434 overlays substrate 1432. A typical material used to make anode 1434 is indium tin oxide. A hole transport region 1436 composed of a hole transport material (HTM) overlays anode 1434, a mixed region 1438 comprising a mixture of a hole transport material and an electron transport material overlays hole transport region 1436, and an electron transport region 1440 composed of an electron transport material (ETM) overlays mixed region 1438. A cathode 1442 overlays electron transport region 1440 and a protective barrier layer 1444 overlays cathode 1442.

Figure 22:
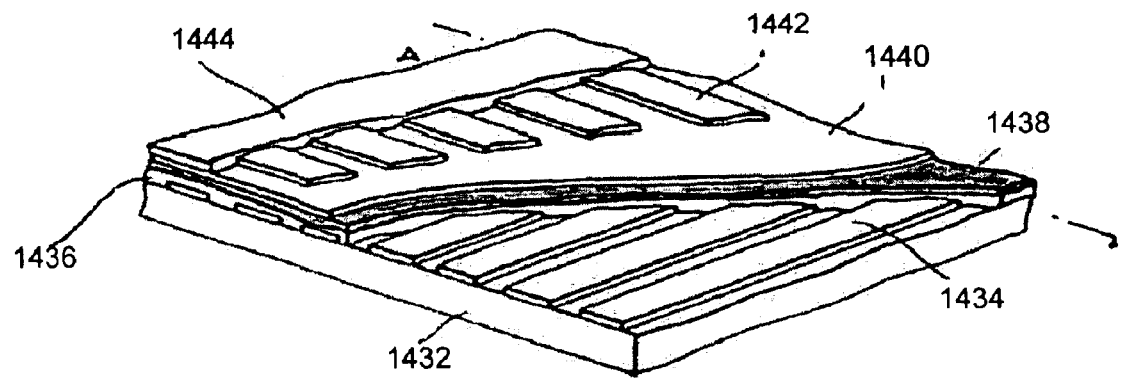
FIG. 22 is a diagram of an organic light emitting diode.

An OLED is a current-driven device. That is, the intensity of the output light is directly proportional to the electrical current flow through the device. An OLED display, therefore, requires the control and modulation of electrical current levels through individual elements (pixels) in order to display text or graphic images. There are two general architectures for addressing pixels in an OLED: passive matrix and active matrix. Referring to FIG. 22, the passive-matrix OLED display is formed by dividing anode layer 1434 into columns and cathode layer 1442 into rows that intersect the anode columns. In typical implementations, the columns provide the data signal while the rows are addressed one at a time. The current flow through a selected row is typically pulsed to a level that is proportional to a level that is a function of the total number of rows in the display. It can be seen in FIG. 22 that barrier layer 1444 overlays the device, thereby protecting the device from adverse environmental elements such as oxygen and water vapor.

Candidate materials include, but are not limited to, titanium dioxide, silicon dioxide, aluminum oxide, zirconia, and silicon-doped titania. Also, use of other metal oxides as dopants to improve the diffusion characteristics of the materials is possible. Control of mixed metal oxide systems is also possible through the use of the PMOD™ deposition methodology.

Another embodiment of the invention envisions the at least partially converted precursor or hard mask formed by the present process serving as an etch resist layer. In the etching step or steps, an etching means, such as plasma, reactive ion or wet etching solution, contacts selected areas of the substrate through the pattern provided by, e.g., the hard mask, removing substrate in those desired areas only. Currently, conventionally-applied hard masks of materials such as silicon dioxide and silicon nitride are used as protective masks in electronics manufacturing processes employing etching.

FIG. 2 illustrates the basic sequence of steps for a preferred embodiment of the process of the present invention, i.e., steps 2A, 2B, 2C and 2D, which is conducted on a substrate 10 as shown in step 2A prior to processing. Substrate 10 may be, for example, a silicon wafer that has been coated with an organic layer. In step 2B, unconverted precursor 11 is applied to the substrate 10. In step 2C, a converting means, such as light in the photochemical metal organic deposition process, or thermal or heat treatment, is applied to at least one selected portion of unconverted precursor 11 to form a converted precursor layer 12. In step 2D, a removing means, such as a developer composition, is used to remove at least a portion and, preferably, substantially all, of the unconverted precursor layer 11, leaving the converted precursor 12 intact, thereby forming a hard mask for the substrate 10. Such a mask suitably allows for certain patterning means to pass into desired areas of the substrate while masking or blocking certain other substrate areas from the patterning means.

Alternately, in step 2C of FIG. 2, a partial converting means, such as light or thermal or heat treatment, may be applied to at least one selected portion of unconverted precursor 11 to form a partially converted precursor layer 12. In step 2D, a removing means, such as a developer composition, is used to remove at least a portion and, preferably, substantially all, of the unconverted precursor layer 11, leaving the partially converted precursor 12 intact. A converting means, not shown, such as light or thermal or heat treatment, can then be used on at least a portion of the partially converted precursor to substantially convert that portion, thereby forming a hard mask. The partial converting means can be the same as or different from the converting means. FIG. 2 demonstrates the economy of steps in forming a patterned hard mask by the process of the present invention.

In contrast, FIG. 3 illustrates the far lengthier prior art method for forming a patterned hard mask. In step 3A, a substrate 200 is supplied as illustrated in FIG. 2. In step 3B, a hard mask layer 210 has been formed on the substrate. For example, the hard mask layer may be 210 silicon oxide. In step 3C, a photoresist layer 220 is applied atop hard mask layer 210. In step 3D, photoresist layer 220 is exposed to light rays 230 through mask 235. Mask 235 comprises a transparent glass substrate 240 having regions 250 substantially opaque to the light rays, thus blocking part of the light rays and forming a pattern on the exposed portion 222 of the photoresist layer. In step 3E, exposed photoresist regions 222 have been developed away, thereby exposing hard mask layer 210. In step 3F, openings 255 in hard mask layer 210 have been formed by etching away the unprotected portions of hard mask layer 210 with a suitable etching composition. In step 3G, the remaining portion of the photoresist layer 220 has been removed. In step 3H, a plasma etching chemistry 260, chosen such that it will etch the substrate 200 but not hard mask layer 210, patterns substrate 200. This results in the patterned features 280 defined as illustrated in step 3I. Thus, it is evident from FIG. 3 that conventional processes require many more steps for forming a patterned hard mask and, e.g., implanting ions through that patterned mask, than does the process of the present invention.

Figure 4E:
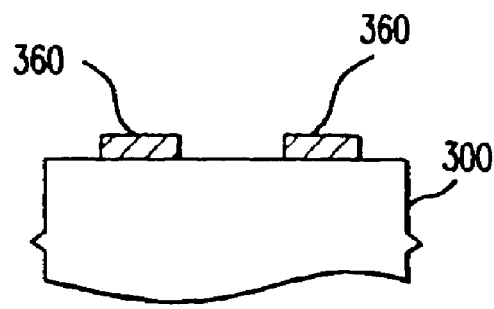
FIG. 4 illustrates a method of fabrication and use of a hard mask according to the present invention.
Figure 4F:
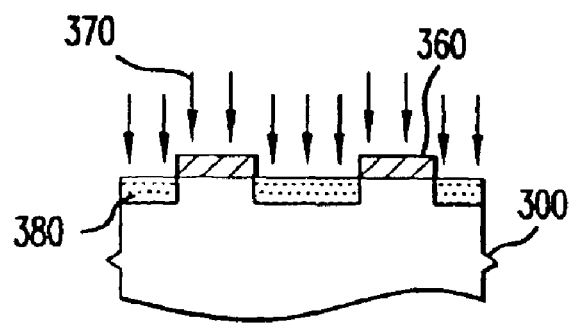
Figure 4G:
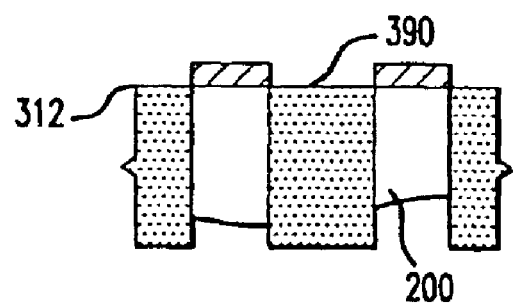
Figure 5F:
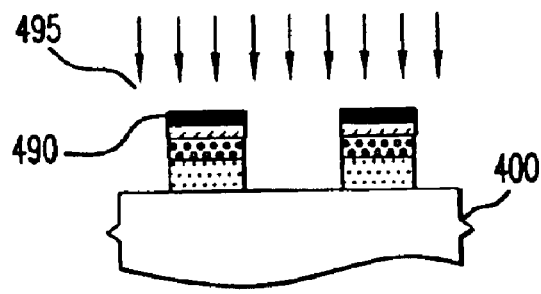
FIG. 5 illustrates a prior art method of patterning by TSI.
Figure 5G:
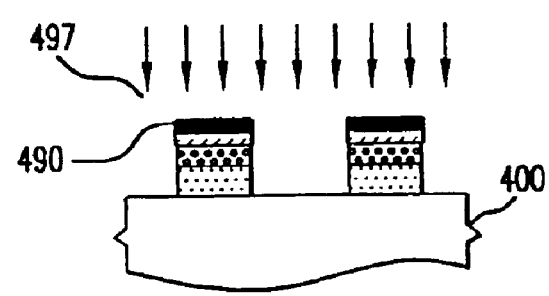
Figure 5H:
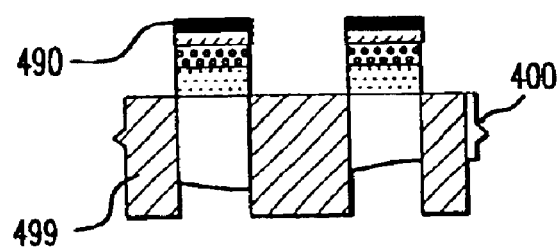
Figure 5I:
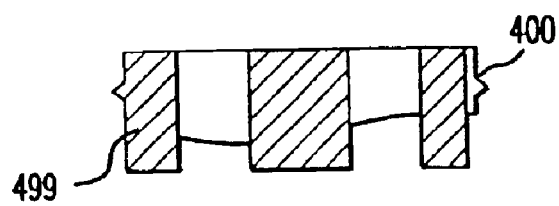
Figure 6E:
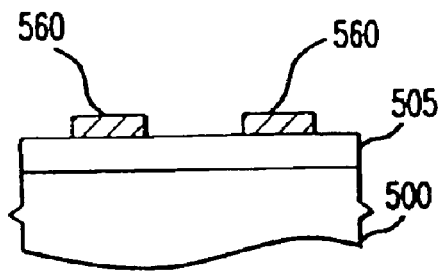
FIG. 6 illustrates a method of fabrication and use of a TSI layer according to the present invention.
Figure 6F:
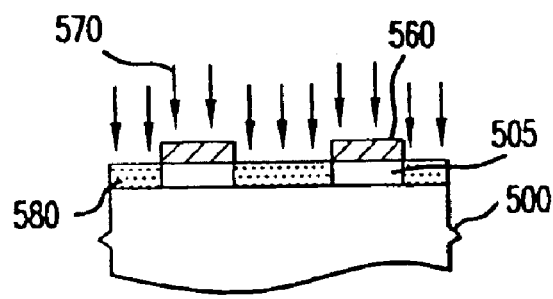
Figure 6G:
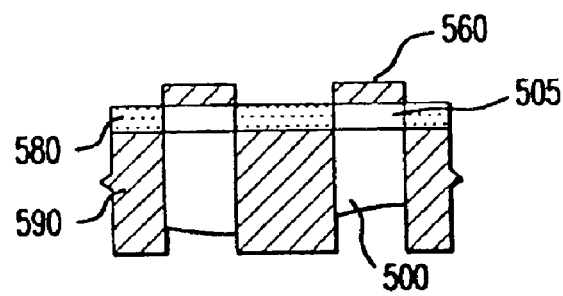
Figure 6H:
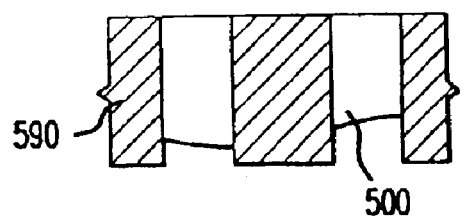
Figure 7A:
FIG. 7 illustrates a prior art method of effecting a liftoff process.
Figure 7B:
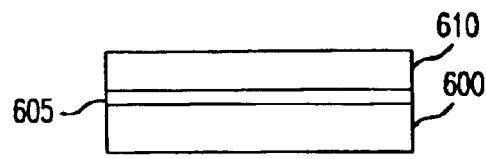
Figure 7C:
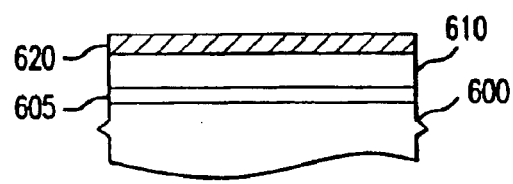
Figure 7D:
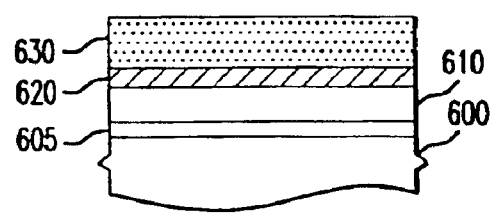
Figure 7E:
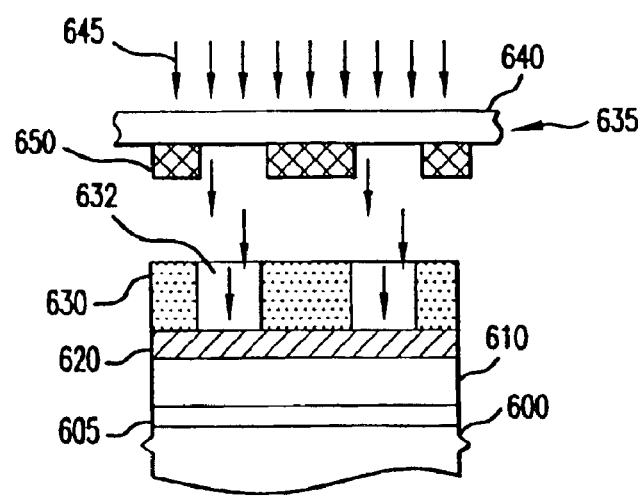
Figure 7F:
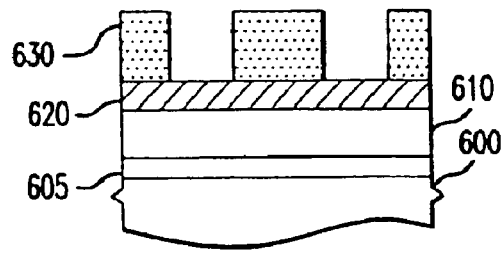
Figure 7G:
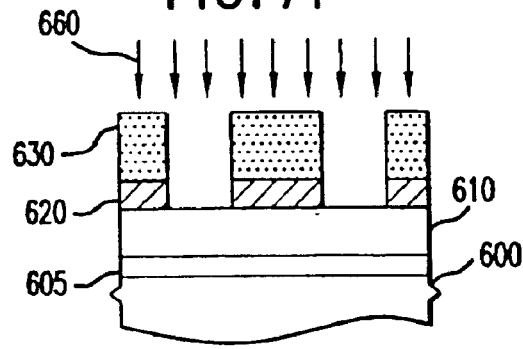
Figure 7H:
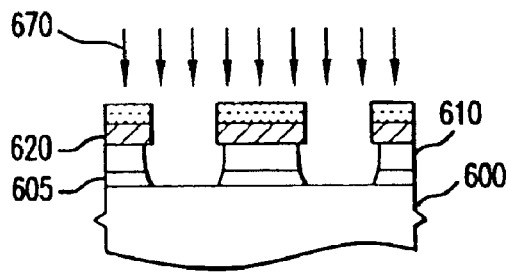
Figure 7I:
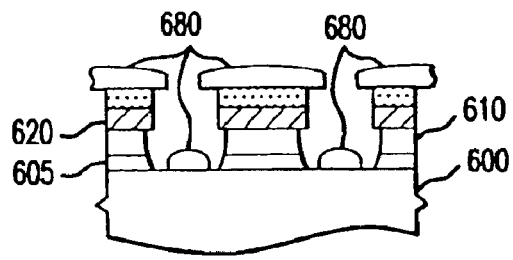
Figure 7J:
Figure 8F:
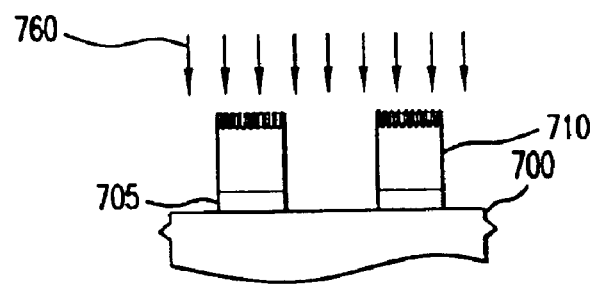
FIG. 8 illustrates a method of effecting a liftoff process according to the present invention.
Figure 8G:
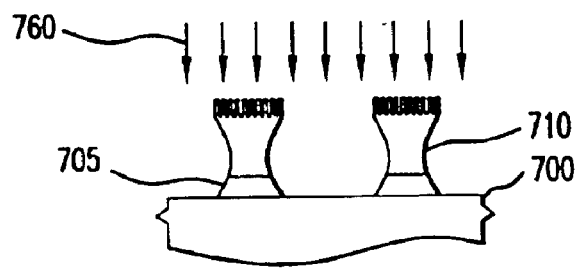
Figure 8H:
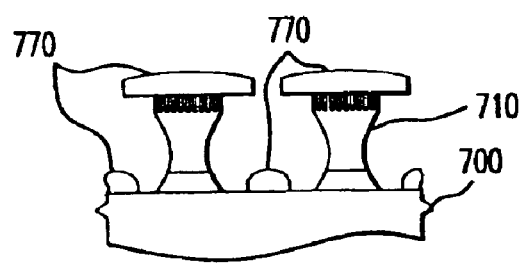
Figure 8I:
Figure 9A:
FIG. 9 illustrates an alternate method of effecting a liftoff process according to the present invention.
Figure 9B:
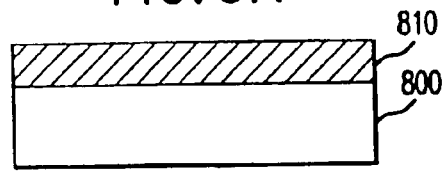
Figure 9C:
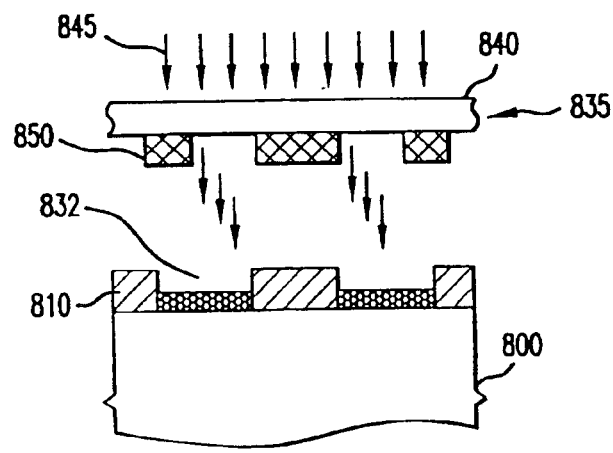
Figure 9D:
Figure 9E:
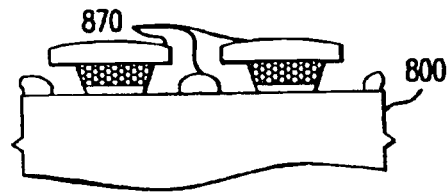
Figure 9F:
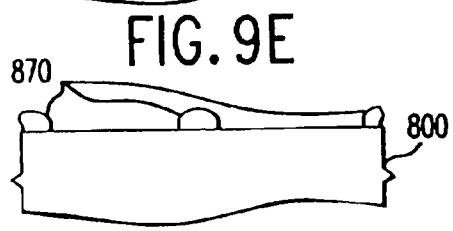
Figure 10A:
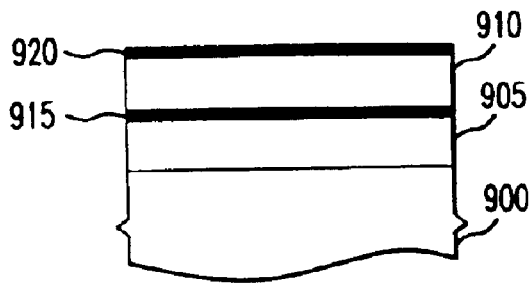
FIG. 10 illustrates a prior art method for dual damascene process integration.
Figure 10B:
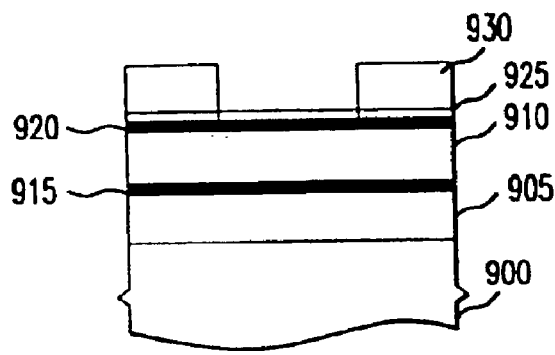
Figure 10C:
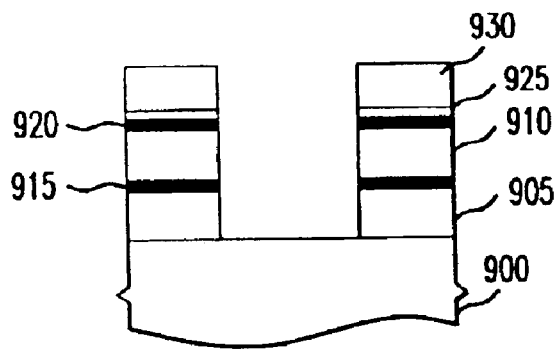
Figure 10D:
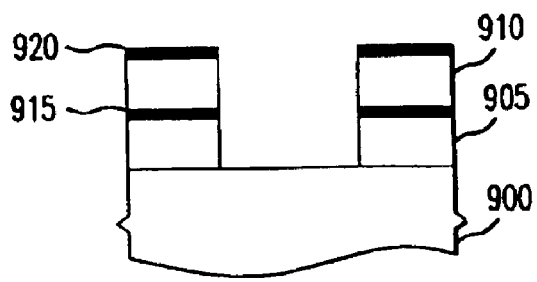
Figure 10E:
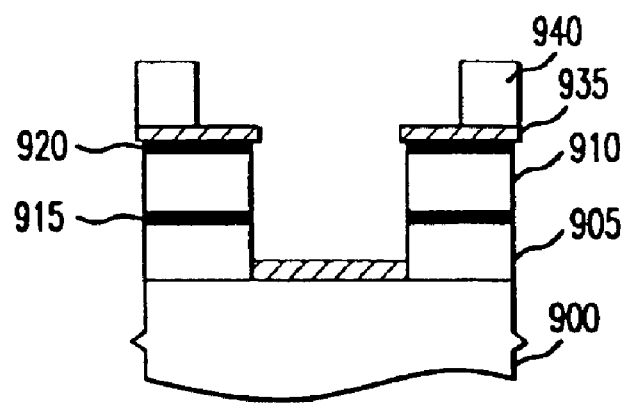
Figure 10F:
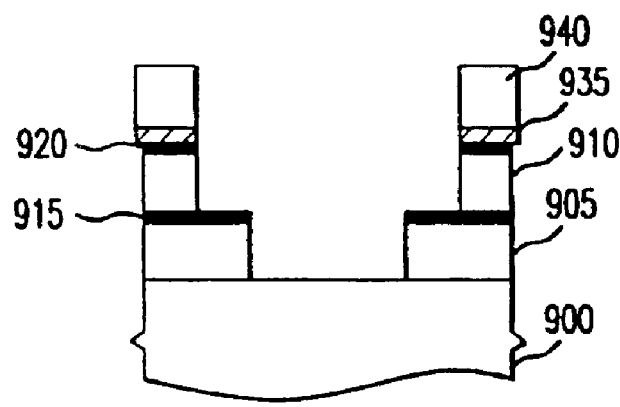
Figure 10G:
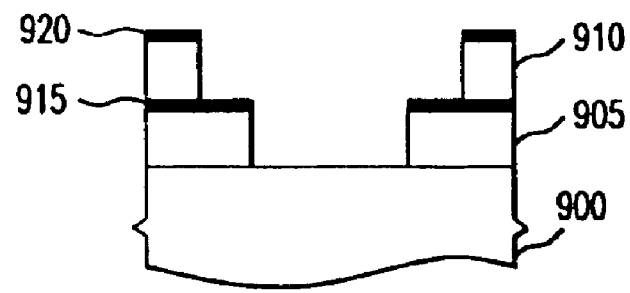
Figure 12A:
FIG. 12 illustrates a prior art method of fabricating an ion implantation hard mask and implanting ions therewith.
Figure 12B:
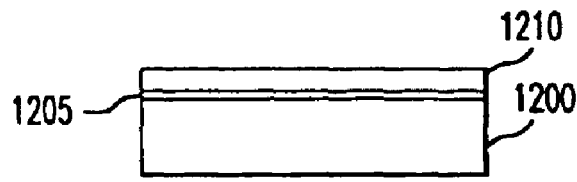
Figure 12C:
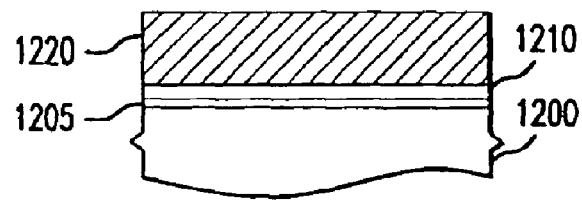
Figure 12D:
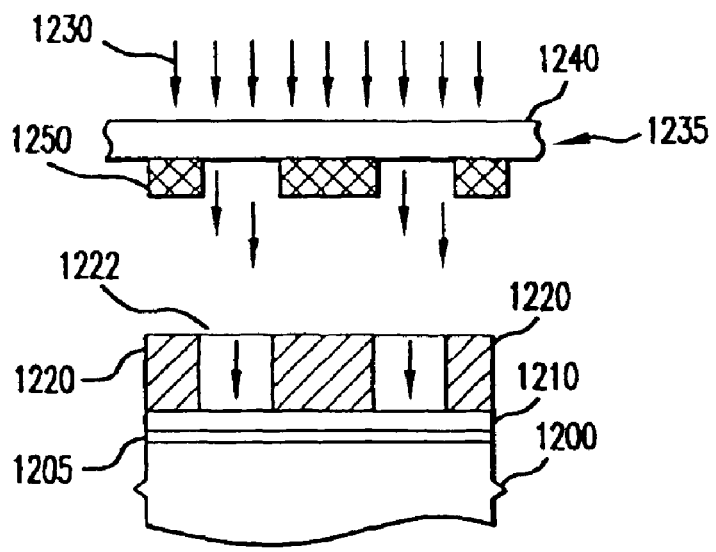
Figure 12E:
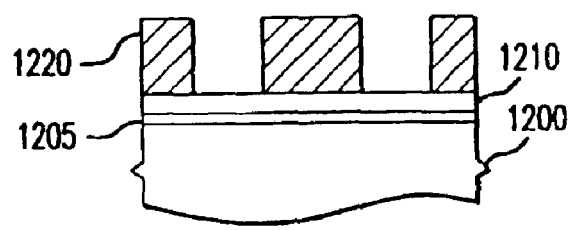
Figure 12F:
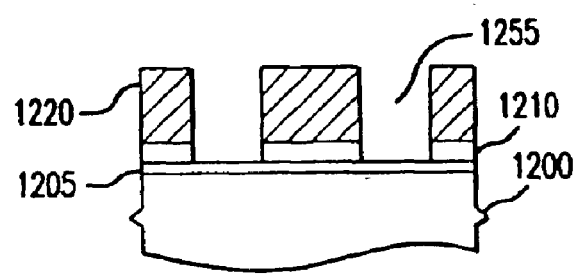
Figure 12G:
Figure 12H:
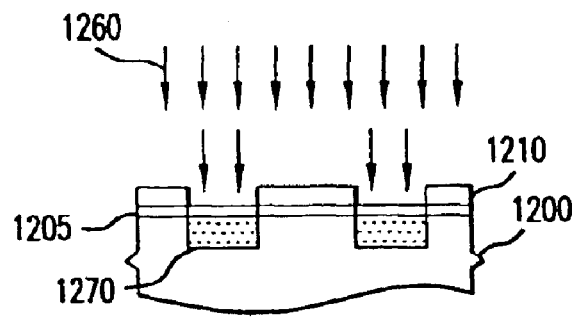
Figure 12I:
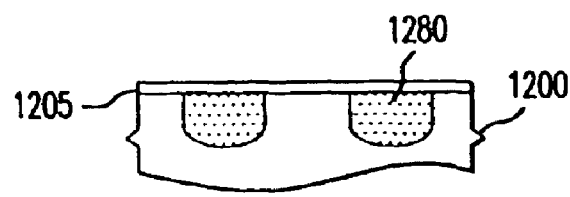
Figure 13A:
FIG. 13 illustrates a process of fabricating an ion implantation hard mask according to an embodiment of the present invention and implanting ions therewith.
Figure 13B:
Figure 13C:
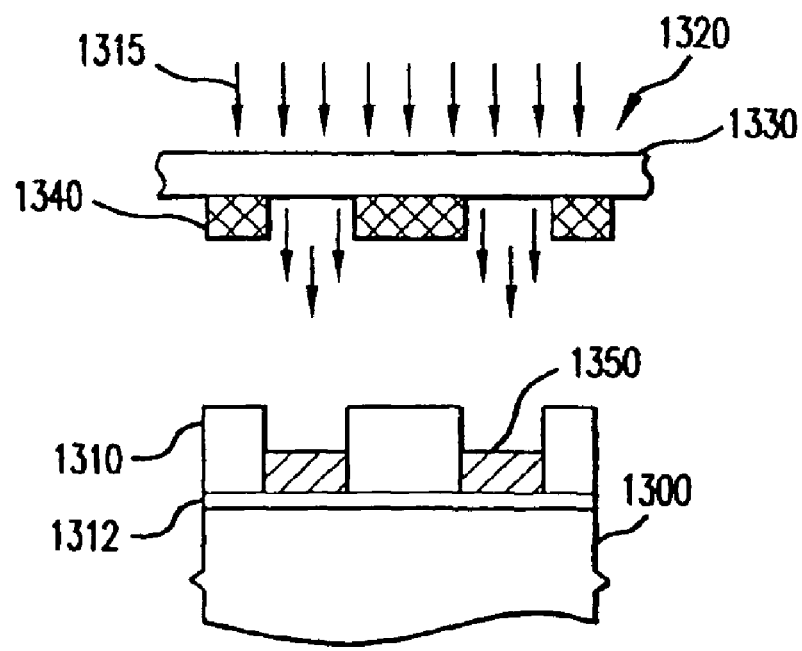
Figure 13D:
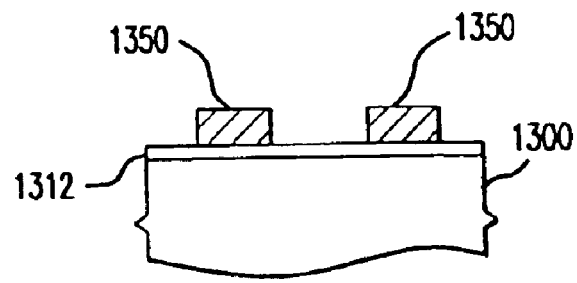
Figure 13E:
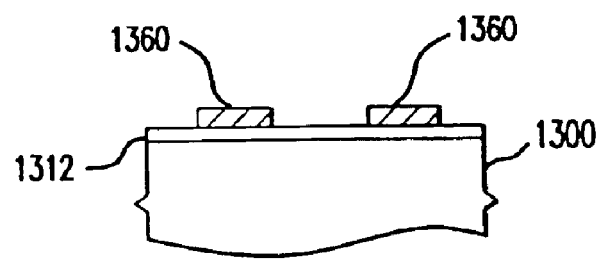
Figure 13F:
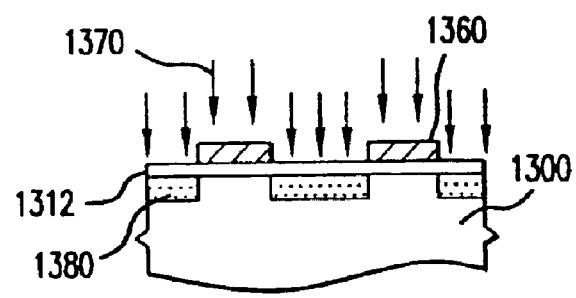
Figure 13G:
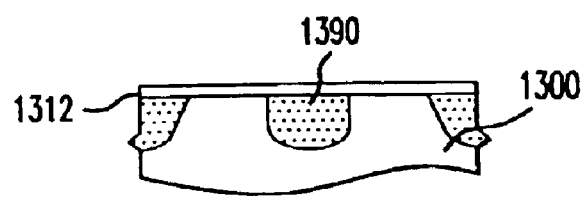

FIG. 4 illustrates a preferred embodiment of the present process applied to fabricating a hard mask using a metal complex precursor to form a patterned hard mask that eliminates all of the steps associated with hard mask etching, i.e., steps 3C through 3G described above. In step 4A, a substrate 300 is supplied as illustrated in FIG. 2. In step 4B, a layer of precursor 310, such a layer comprising a metal complex, has been formed on top of substrate 300. In step 4C, precursor 310 is exposed to a converting means and/or a partial converting means, light rays 315 being illustrated here, directed through mask 320. Mask 320 includes a transparent glass substrate 330 having regions 340 substantially opaque to the partial converting means. The portion of precursor 310 exposed to converting means and/or partial converting means 315 is at least partially converted or reacted to form regions of partially converted precursor 350. Preferably, precursor 310 is substantially fully converted in step 4C. In step 4D, the assembly has been exposed to a removing means (not shown) such as a liquid developer. Substantially unconverted precursor 310 has been removed by the developer or removing means, exposing substrate 310, while converted or partially converted precursor 350 which, being at least partially converted, resists the removing means, remains. In optional step 4E, a converting means (not shown) is applied to the partially converted precursor 350, if that precursor has not been previously substantially fully converted in step 4C, to form substantially fully converted precursor 360, i.e., a patterned hard mask. This conversion may be accomplished, e.g., by a blanket light exposure step or a thermal or heat annealing step. In each of steps 4C and 4E, the conversion is preferably performed in the presence of oxygen if the converted precursor 360 is to be a dielectric film, or in the presence of a reducing gas, such as hydrogen, if the converted precursor 360 is to be a metallic film. In step 4F, an etching means, here plasma etching chemistry 370 chosen such that it will etch the substrate 300 but not hard mask layer 360, patterns substrate 300. This results in the patterned features 390 defined as illustrated in step 4G.

FIG. 5 illustrates a prior art method of forming a TSI in a photoresist, for example, by the process commonly known as top silylation imaging. In step 5A, a substrate 400 is provided. In step 5B, substrate 400 is coated with a photoresist layer 410 suitable for top silylation. In step 5C, photoresist layer 410 is exposed to light rays 430 through mask 435. Mask 435 includes a transparent glass substrate 440 having regions 450 substantially opaque to the exposure means, thus blocking part of the light rays and forming a pattern on the exposed portion 432 of the photoresist layer. The exposed photoresist region 432 is given different chemical and/or physical properties as a result of this exposure. In step 5D, the substrate 400, photoresist layer 410 and exposed photoresist regions 432 are exposed to a gaseous TSI reagent 460, which selectively adsorbs to exposed photoresist regions 432, forming modified photoresist surfaces 470. Examples of TSI reagent 460 well known to the art include silicon-containing gases.

In step 5E, the surface is exposed to plasma treatment 480, rendering modified photoresist surface 470 chemically more inert, thereby forming resist hard mask surface 490. In step 5F, plasma treatment 495 removes the remaining photoresist 410 directly underneath the resist hard mask surface 490. In step 5G, plasma treatment 497 is employed to pattern substrate 400 using the complex stack formed from photoresist layer 410, modified photoresist surface 470, and resist hard mask surface 490, to define the pattern transferred to substrate 400. The resulting pattern is illustrated by etched region 499 in step 5H. In step 5I, a removing means (not shown) has been employed to remove the complex stack formed from photoresist layer 410, modified photoresist surface 470, and resist hard mask surface 490. While the method illustrated in FIG. 5 confers the advantages of forming thin surface layers for patterning, which aid in improving the resolution that can be obtained and in the relaxation of depth-of-focus demands, it suffers the disadvantages of requiring TSI reagent 460, requiring multiple plasma treatment steps, and involving added cost and complexity in pattern transfer not present in other conventional techniques.

In contrast, FIG. 6 illustrates a preferred embodiment of the present process applied to TSI using a metal complex precursor to form a patterned thin top surface. In step 6A a substrate 500, coated with pattern transfer layer 505, is provided. Pattern transfer layer 505 may optionally comprise an organic film-forming resins including photoresist, polyimide, PMMA, Novolac, epoxy, and other organic or related coatings known to one in the art. In step 6B, a layer of precursor 510 has been formed on top of substrate 500 and directly over pattern transfer layer 505. In this case, precursor 510 comprises a metal complex. In step 6C, precursor 510 is exposed to a converting and/or partial converting means, light rays 515 being illustrated here, directed through mask 520. Mask 520 includes transparent substrate 530, exemplified as glass here, having regions substantially 540 opaque to the converting or partial converting means. The portion of precursor 510 exposed to converting and/or partial converting means 515 is at least partially converted or reacted to form regions of partially converted precursor 550. Preferably, precursor 550 is substantially fully converted. In step 6D, the assembly has been exposed to a removing means (not shown) such as a liquid developer. Substantially unconverted precursor 510 has been removed by the removing means, e.g., a developer, exposing pattern transfer layer 505, while at least partially converted precursor 550 which, being at least partially converted, resists the removing means, remains. In optional step 6E, a converting means (not shown) is applied to the partially converted precursor 550, if it has not already been substantially fully converted, to form substantially fully converted precursor 560. This conversion may be accomplished, e.g., by a blanket light exposure step or a thermal or heat annealing step.

In step 6F, the surface is exposed to an etching means 570, such as plasma etching chemistry which is exemplified. For example, a plasma etching means may consist essentially of oxygen. The etching means removes exposed areas of pattern transfer layer 505 while partially converted or substantially fully converted precursor layer 560 has been chosen and processed in such a fashion so as to render it substantially inert toward the etching means 570, such that etched regions 580 are formed. In step 6G, subsequent patterning (not shown) of substrate 500 is effected by an etching means making use of the pattern formed in pattern transfer layer 505 underneath at least partially converted precursor 560 to form etched regions 590. In step 6H, a removing means (not shown) has removed all of the remaining pattern transfer layer 505 and converted precursor 560, exposing the desired patterned substrate 500 with etched regions 590. The method of FIG. 6 is superior to that shown in FIG. 5 as it requires fewer steps, fewer plasma steps and demands no TSI reagent. At the same time, the method of FIG. 6 retains all of the advantages conferred by employing the method of FIG. 5.

FIG. 7 illustrates a prior art method of depositing a patterned metal layer atop a substrate. This method is conventionally employed when the desired metal is difficult to etch, e.g., gold or platinum. In step 7A a substrate 600 is provided. In step 7B, a release layer 605 has been coated atop substrate 600, and on top of release layer 605 a liftoff layer 610 has been applied. In step 7C, optional hard mask layer 620 has been deposited on top of liftoff layer 610. In step 7D, photoresist layer 630 has been applied to the top of the complex stack composed of optional hard mask layer 620, liftoff layer 610 and release layer 605. In step 7E, photoresist layer 630 is exposed to light rays 645 through mask 635. Mask 635 includes a transparent glass substrate 640 having regions 650 substantially opaque to the exposure means, thus blocking part of the light rays and forming a pattern on the exposed portion 632 of the photoresist layer. In step 7F, a removing means, such as a wet developer, is applied to remove the exposed portions 632 in the photoresist layer 630.

In step 7G, plasma etching chemistry 660 is used to etch through optional hard mask layer 620, if present. Plasma etching chemistry 660 may also have the effect of eroding a substantial portion of the thickness of photoresist layer 630. In step 7H, plasma etching chemistry 670 is used to etch through liftoff layer 610 and release layer 605. It is possible, during this step to create sidewalls, which are preferably curved as illustrated in step 7H, by employing plasma etching chemistry 670 first in an anisotropic mode, such that charged species in the plasma move primarily in the vertical direction, and then switching to isotropic mode, in which the charged species in the plasma that are responsible for etching move equally in all directions. The result of this manipulation is illustrated in step 7H. In step 7I a depositing means has been employed to cover the features of the surface with desired metal 680 (e.g., gold, platinum or other desired metal). In step 7J a removing means (not shown) has been employed to lift off, e.g., by a solvent treatment, all of the remaining release layer 605, liftoff layer 610, hard mask layer 620 (if present), and photoresist layer 630. This leaves behind only the desired pattern of desired metal 680 on substrate 600. This method of patterned metal deposition is difficult, involving many steps and requiring the use of thick layers of photoresist. Such thick layers require that more than a desirable amount of photoresist are consumed, which is expensive. In addition, the removal of the photoresist is rendered more difficult by its extreme thickness than would otherwise be the case.

FIG. 8, in contrast, illustrates a preferred embodiment of the present process applied to liftoff processing using a metal complex precursor to form a patterned thin top surface over a liftoff layer. In step 8A, a substrate 700 has been provided. In step 8B, substrate 700 has been coated with release layer 705 and release layer 705 coated with liftoff layer 710. In step 8C, precursor layer 720 is coated over liftoff layer 710. In this case, precursor 720 comprises a metal complex. In step 8D, precursor 720 is exposed to a converting and/or partial converting means, here light rays 745 are exemplified, directed through mask 735. Mask 735 includes a transparent glass substrate 740 having regions 750 substantially opaque to the converting and/or partial converting means. The portion of precursor 720 exposed to the converting and/or partial converting means 745 is at least partially converted or reacted to form regions of at least partially converted precursor 732. Preferably, precursor 732 is substantially fully converted. In step 8E, the assembly has been exposed to a removing means (not shown) such as a liquid developer. Substantially unconverted precursor 720 has been removed by the developer or removing means, exposing liftoff layer 710, while at least partially converted precursor 732 which, being at least partially converted, resists the removing means, remains. In an optional step (not shown), a converting means (not shown) is applied to the partially converted precursor 732 to form substantially fully converted precursor, if precursor 732 has not already been substantially fully converted. In step 8F, removing means 760, for example, plasma etching chemistry, is employed in an anisotropic fashion to remove those areas of liftoff layer 710 and underlying release layer 705 not underneath precursor 732. In step 8G, a liftoff curved profile, e.g., as illustrated, is formed by allowing removing means 760 to isotropically etch. liftoff layer 710 and release layer 705. In step 8H, a film of the desired metal 770 is deposited by a depositing means over the assembly. In step 8I, unwanted portions of desired metal 770 are removed along with precursor 732, liftoff layer 710 and release layer 705, by a developing means, for example solvent or dry development process, leaving behind the desired pattern of desired metal 770 on top of substrate 700. This method is preferable to the prior art method outlined in FIG. 7 as it requires fewer process steps and does not require the use of a photoresist.

FIG. 9 illustrates yet another preferred embodiment of the present process applied to liftoff processing using a metal complex precursor to form a patterned thin top surface film over a liftoff layer. In step 9A a substrate 800 is provided. In step 9B, precursor layer 810 is coated over substrate 800. In this case, precursor 810 comprises a metal complex. In step 9C, precursor layer 810 is exposed to a converting means and/or partial converting means, here light rays 845 are exemplified, directed through mask 835. Mask 835 includes a transparent glass substrate 840 having regions 850 substantially opaque to the converting and/or partial converting means. The portion of precursor 810 exposed to converting and/or partial converting means 845 is at least partially converted or reacted to form regions of exposed regions 832. In step 9D, the assembly has been exposed to a removing means (not shown) such as a liquid developer. Substantially unconverted precursor 810 has been removed by the removing means, exposing substrate 800, while exposed regions 832 which, being at least partially converted, resists the removing means, remains. Optionally, as described in other preferred embodiments of the invention, the exposed regions 832 may be subjected to further conversion after the removing means step 9D if they have not been previously substantially fully converted. The inwardly-tapering sidewall profiles present in exposed regions 832, as illustrated in step 9D, are obtained by the appropriate control over the exposure and removing means represented in steps 9C and 9D, respectively, e.g., as described in steps 8D, 8F and 8G above. In step 9E, a film of the desired metal 870 is deposited by a depositing means over the assembly. In step 9F, unwanted portions of desired metal 870 are removed along with precursor 832 by a developing means, for example solvent or dry development process, leaving behind the desired pattern of metal 870 on top of substrate 800.

In another preferred embodiment of the present process, the use of TSI layer, integration can be used to construct dual damascene architectures for copper integration into semiconductor interconnect structures. FIG. 10, steps A through H, illustrates one prior art method of constructing a damascene architecture, referred to as the "via-first" method. In step 10A, a substrate 900 is provided, which has been coated successively as indicated with a first dielectric layer 905, a barrier layer 915, a second dielectric layer 910, and a hard mask 920. The dielectric layers 905 and 910 are commonly but not necessarily the same material, while the barrier and hard mask layers 915 and 920 may or may not be the same material, but are frequently either silicon nitride and/or silicon oxide. In step 10B, the assembly has been coated, atop hard mask 920, with a bottom anti-reflective-coating ("BARC") 925 and photoresist layer 930. As illustrated, the photoresist layer has been patterned and developed by conventional methods. In step 10C, plasma etching chemistry has been used to remove the indicated portions of BARC layer 925, hard mask 920, dielectric layer 910, barrier layer 915, and dielectric layer 905. In step 10D, remaining photoresist 930 and BARC 925 have been removed from the assembly following the plasma process of step 10C. In step 10E, a second BARC layer 935 and second photoresist layer 940 have been applied to the assembly atop hard mask 920; as illustrated, photoresist layer 940 has been patterned and developed by conventional methods. In step 10F, a second plasma etching chemistry step has been used to remove the indicated portions of BARC layer 935 and dielectric layer 910. In step 10G, remaining photoresist 940 and BARC 935 have been removed following the plasma process of step 10F.

In contrast, FIG. 11 illustrates how a process of the invention may accomplish the assembly of a dual damascene architecture with many fewer process steps. In step 11A, a substrate 1000 coated with dielectric layer 1005 is provided. In step 11B, a precursor layer, e.g., comprising a metal complex, has been applied atop the dielectric layer, patterned by at least partial conversion and, preferably, substantially full conversion, and then developed by techniques such as those discussed previously in other embodiments of the invention to yield patterned layer 1010 as illustrated. For example, the pattern development step can be performed by, e.g., solvent or dry development process, as described above. A spin planarization layer 1015 is then applied atop patterned layer 1010. The spin planarization layer 1015 may be any organic-based coating that can be spun on to the assembly. In step 11C, a second patterned layer 1020 has been deposited, patterned and developed as illustrated, e.g., using techniques identical to those employed in the formation of patterned layer 1010. In step 11D, an etching means (not shown), such as plasma etching chemistry, has been employed to remove the illustrated region of spin planarization layer 1015 and a portion of the thickness of dielectric layer 1005. It is important that the etching means be controlled such that only part of the thickness of dielectric layer 1005 is removed, as shown. For example, plasma etching exposure limited to a time less than would be required to etch through the entire dielectric layer thickness can be used.

In step 11E, patterned layer 1020 and spin planarization layer 1015 have been removed by a removing means, such as treatment of the assembly with a solvent in which spin planarization layer 1015 is soluble and which does not have substantially deleterious effect on other parts of the assembly. In step 11F, a controlled etching means (not shown), such as the plasma etching chemistry described above, has been employed to remove the illustrated region of dielectric layer 1005. This controlled etch simultaneously removes the remaining thickness of dielectric layer 1005 in the pattern formed by patterned layer 1020 but only removes part of the thickness of dielectric layer 1005 in the pattern formed by patterned layer 1010. A dual damascene mold can be assembled in this fashion.

Patterned layer 1010 may optionally be removed following step 11F (not shown); alternately, it is a further embodiment of the invention that the patterned layer 1010 remain to be employed as a CMP stop following copper deposition and planarization.

It is evident that the process illustrated in FIG. 11 is superior to the prior art method illustrated in FIG. 10, as the former involves many fewer process steps, does not require multiple photoresist and BARC steps, and obviates the need for the barrier and hard masks employed in conventional processes.

FIG. 12 illustrates the complex method of implanting ions facilitated by prior art methods for forming a patterned ion implant mask. In step 12A, a substrate 1200 is supplied as illustrated in FIG. 2. In step 12B, an optional protective layer 1205 has been formed on substrate 1200 followed by implant mask layer 1210. In one example, implant mask layer 1210 is a silicon oxide. In step 12C, a photoresist layer 1220, is applied to the substrate 1200 on top of implant mask layer 1210. In step 12D, photoresist layer 1220 is exposed to light rays 1230 through mask 1235. Mask 1235 includes a transparent glass substrate 1240 having regions substantially opaque to the exposure means 1250, thus blocking part of the light rays and forming a pattern on the exposed portion 1222 of the photoresist layer. In step 12E, exposed photoresist regions 1222 have been developed away exposing implant mask layer 1210. In step 12F, openings 1255 in implant mask layer 1210 have been formed by etching away the unprotected portions of implant mask layer 1210 with a suitable etching composition. In step 12G, the remaining portion of the photoresist layer 1220 has been removed. In step 12H, substrate 1200 is exposed to ion beam 1260 in order to form implanted regions 1270 directly under openings 1255 in the implant mask. In optional step 12I, the implant mask layer 1210 has been removed and the substrate annealed, thereby converting implanted regions 1270 into doped regions 1280. Thus, it is evident from FIG. 12 that conventional processes require many steps for forming a patterned implant mask and, e.g., implanting ions through that patterned mask, than does the process of the present invention.

In contrast, FIG. 13 illustrates another preferred embodiment of the present process applied to fabricating an ion implantation hard mask using a metal complex precursor to form a patterned implant mask that eliminates all of the steps associated with implant mask etching, i.e., steps 12C through 12G described above. In step 13A, a substrate 1300 is supplied. In step 13B, an optional protective layer 1312 has been formed on substrate 1300 and a layer of precursor 1310 has been formed on top of protective layer 1312. In this case, precursor 1310 is a metal complex. In step 13C, precursor 1310 is exposed to a converting and/or partial converting means, here, light rays 1315 directed through mask 1320. Mask 1320 includes a transparent glass substrate 1330 having regions 1340 substantially opaque to the partial converting means. The portion of precursor 1310 exposed to converting and/or partial converting means 1315 is at least partially converted or reacted to form regions of partially converted precursor 1350. In step 13D, the assembly has been exposed to a removing means (not shown) such as a liquid developer. Unconverted precursor 1310 has been removed by the developer or removing means, exposing protective layer 1312, while partially converted precursor 1350 which, being partially converted, resists the removing means, remains. In optional step 13E, a converting means (not shown) is applied to the partially converted precursor 1350, if a partial converting means was used in step 13C, to form substantially fully converted precursor 1360. This conversion may be accomplished, e.g., by a blanket light exposure step or a thermal annealing step. In each of steps 13C and 13E, the conversion is preferably performed in the presence of oxygen if the converted precursor 1360 is to be a dielectric film, or in the presence of a reducing gas, such as hydrogen, if the converted precursor 1360 is to be a metallic film. In step 13F, substrate 1300 is subjected to an implantation means, such as an ion beam 1370, in order to form implanted regions 1380 in the substrate. In optional step 13G, the implant mask has been removed and a thermal annealing process performed in order to convert implanted regions 1370 into doped regions 1390 in the substrate.

The broad scope of the process of the present invention allows for a wide range of possible applications. A preferred embodiment of the invention comprises an amorphous metal oxide film used to form an integral capacitive structure within a printed wire board ("PWB"), wherein a PWB substrate is coated and directly imaged by the present process using an appropriate precursor solution. Advantages of the present invention include the ability for direct imaging and associated elimination of other process steps, the use of ambient temperatures and pressures required for PWB processing, and the formation of films with acceptably high capacitance.

In another preferred embodiment, a patterned metal oxide or a mixed metal oxide film is formed, by the present process, into an opaque pattern on a transparent substrate. Such implements may be used as patterning masks for the lithographic transfer of patterns during the semiconductor manufacturing process.

In yet another preferred embodiment of the invention, an amorphous metal oxide or mixed metal oxide film is used to form a decoupling capacitive structure within the interconnect levels of an advanced interconnect semiconductor device wherein a modified silicon substrate is coated and directly imaged by the present process with an appropriate precursor solution. Advantages implicit in this embodiment include the ability for direct imaging, thereby eliminating many other process steps, and the use of ambient temperatures and pressures not otherwise available in the assembly of such advanced interconnects.

A further preferred embodiment of the invention envisions the use of precursor films that may be used to pattern memory storage elements in either capacitive storage nodes, i.e., dynamic random access memory ("DRAM"), or as ferroelectric memory storage nodes ("FeRAM"). Again, advantages implicit in this embodiment include the ability for direct imaging, thereby eliminating many other process steps, and the use of ambient temperatures and pressures not otherwise available in the assembly of such memory devices.

Yet another preferred embodiment of the invention envisions the formation of gate dielectric materials at the front end of semiconductor manufacture, as advanced silicon-based devices make a transition in the preferred gate dielectric material, from silicon dioxide to new materials having a higher dielectric constant. The new higher dielectric constant materials allow the gate dielectric to be made physically thick relative to silicon dioxide for equivalent electrical properties. This greater physical thickness can allow for greater ease of manufacture and minimized quantum tunneling effects through the gate. That the process of this invention has major advantages over other known processes in terms of lower temperatures and less stringent vacuum processing requirements is highly significant when applied to front end of the line ("FEOL") semiconductor processing. A wide variety of high dielectric constant materials are amenable to the process of the invention, including but not limited to $Ba_xSr_yTi_zO_3$ ("BST"), $BaTiO_3$, $SrTiO_3$, $PbTiO3$, $Pb_xZr_yTi_zO_3$ ("PZT"), (Pb, La)(Zr, Ti)$O_3$ ("PLZT"), (Pb, La)$TiO_3$ ("PLT"), $LiNbO_3$, $Ta_2O_5$, $SrBi_2Ta_2O_9$, $Al_2O_3$, $TiO_2$, $ZrO_2$, $HfO_2$, and perovskite materials.

Similarly, the invention may be employed to fabricate gate electrode materials for FEOL semiconductor manufacture. These materials rest atop the gate dielectric forming an electrical contact to the gate dielectric. Historically, gate electrodes have been constructed from silicon. In an analogous fashion to the migration of gate dielectric material away from silicon dioxide, there is impetus to transition gate electrodes to materials having substantially better performance characteristics than silicon. Candidate materials for gate electrode use include platinum, iridium, ruthenium, ruthenium oxide, iridium oxide and other new materials. All of these materials are conventionally challenging to deposit and pattern, however, they are amenable to use in the present process. Additionally, many of the steps in conventional methods invoke high temperatures, stringent vacuum requirements, and the use of harsh plasma processing conditions, which threatens to damage the sensitive silicon substrate. Such harsh conditions can be avoided by employing the process of the present invention. More challenging still for conventional processes is the need for different electrode materials to be placed over gate transistors of different bias, as described in U.S. Pat. No. 6,048,769. This requirement for conventional integration paths doubles an already large number of steps; hence this preferred embodiment of the invention provides dramatic advantages, from a manufacturing standpoint, to lower this large number of steps.

The applicability of noble metals and conducting metal oxides is not limited to gate electrode formation. There are several barrier layer applications for such materials, both as the conducting and insulating layers that are mandated in FEOL semiconductor processing. It is evident that several of these applications rely on the formation of a film of the desired material that has a high dielectric constant ("high-k") for use as a capacitive material. In a similar fashion, films may be optimized so as to optimize the film's permeability (u) for use as an inductor material. Resistive elements are similarly possible, as are magnetic, piezoelectric, pyroelectric and ferroelectric elements.

Other possible applications for the process of the present invention are wide and varied. Some examples include: direct patterned deposition of high dielectric constant materials for semiconductor manufacturing (transistor gate stack, capacitive structures, etc.); direct patterned deposition of high dielectric constant materials for microelectronics packaging (capacitive structures); low temperature deposition of high dielectric constant materials for semiconductor manufacturing (transistor gate stack, capacitive structures, etc.); low temperature deposition of high dielectric constant materials for microelectronics packaging (capacitive structures, etc.); non-vacuum based deposition of high dielectric constant materials for semiconductor manufacturing (transistor gate stack, capacitive structures, etc.); non-vacuum based deposition of high dielectric constant materials for microelectronics packaging (capacitive structures, etc.); direct patterned deposition of metal oxides for semiconductor manufacturing (insulator structures, etc.); direct patterned deposition of metal oxides for microelectronics packaging; low temperature deposition of metal oxides for semiconductor manufacturing; low temperature deposition of metal oxides for microelectronics packaging (capacitive structures, etc.); non-vacuum based deposition of metal oxides for semiconductor manufacturing; non-vacuum based deposition of metal oxides for microelectronics packaging; direct patterned deposition of metals for semiconductor manufacturing (transistor gate stack); direct patterned deposition of metals for microelectronics packaging (interconnects, etc.); low temperature deposition of metals for semiconductor manufacturing; low temperature deposition of metals for microelectronics packaging; non-vacuum based deposition of metals for semiconductor manufacturing; non-vacuum based deposition of metals for microelectronics packaging; direct patterned deposition of resistive materials for semiconductor manufacturing (on-chip resistive elements); direct patterned deposition of high resistive materials for microelectronics packaging (embedded resistors); low temperature deposition of resistive materials for semiconductor manufacturing; low temperature deposition of resistive materials for microelectronics packaging (embedded resistors); non-vacuum based deposition of resistive materials for semiconductor manufacturing; non-vacuum based deposition of resistive materials for microelectronics packaging; controlled resistivity materials via mixed metal/oxide deposition; direct patterned deposition of materials for inductor fabrication in semiconductor manufacturing (on-chip inductors); direct patterned deposition of materials for inductor fabrication for microelectronics packaging (embedded inductors); low temperature deposition of materials for inductor fabrication for semiconductor manufacturing; low temperature deposition of materials for inductor fabrication for microelectronics packaging (embedded inductors); non-vacuum based deposition of materials for inductor fabrication for semiconductor manufacturing; non-vacuum based deposition of materials for inductor fabrication for microelectronics packaging; direct patterned deposition of metal and oxide materials for fabrication of devices using organic semiconductors and/or organic substrates; low temperature deposition of metal and oxide materials for fabrication of devices using organic semiconductors and/or organic substrates; non-vacuum based deposition of metal and oxide materials for fabrication of devices using organic semiconductors and/or organic substrates; use as a photosensitive, e-beam sensitive layer in a bilayer or TSI photoresist process; directly patterned, low temperature, non-vacuum based deposition of magnetic materials; deposition of mixed metal and mixed oxide materials; screen printing of metal and metal oxide structures; inkjet-like (droplet) printing of metal and metal oxide structures; spray coating of metal/oxide films on surfaces; use of these materials to allow for liquid phase coating (spin-coating or meniscus coating) of thick films to simplify and improve the coating process and performance and then making use of the volume shrinkage upon conversion to result in thin coatings (such an application is in the formation of embedded capacitors where thick layers are coated that produce thin final films to improve the capacitance of the structures); liquid coating and subsequent photochemical or low temperature thermal conversion of organometallic precursors to deposit metal or metal oxide coatings on polymer/natural fibers (coat silver/silver oxide for example for anti-microbial fibers and textiles for hospital use, odor resistant garments such as socks or pads); liquid infiltration and subsequent thermal conversion of precursors to form catalytically active porous materials; use as an additive to polymer solutions to modify the physical, chemical, optical, and electrical properties of the resulting material by forming nanocomposites; synthesis and formulation of water soluble precursors to reduce VOC emissions from the processes mentioned above; gate electrode materials; flat panel displays; FeRAM; direct-write materials; microfluidics; masks; and waveguides.

Additional descriptions of processes for the fabrication of electronic materials include those described in concurrently-filed U.S. patent application Ser. No. 09/874,330, entitled "Method of and Apparatus for Substrate Pretreatment," the disclosure of which is incorporated herein by express reference thereto.

EXAMPLE

The following examples further illustrate certain embodiments of the present invention. These examples are provided solely for illustrative purposes and in no way limit the scope of the present invention.

Example 1

Figure 14:
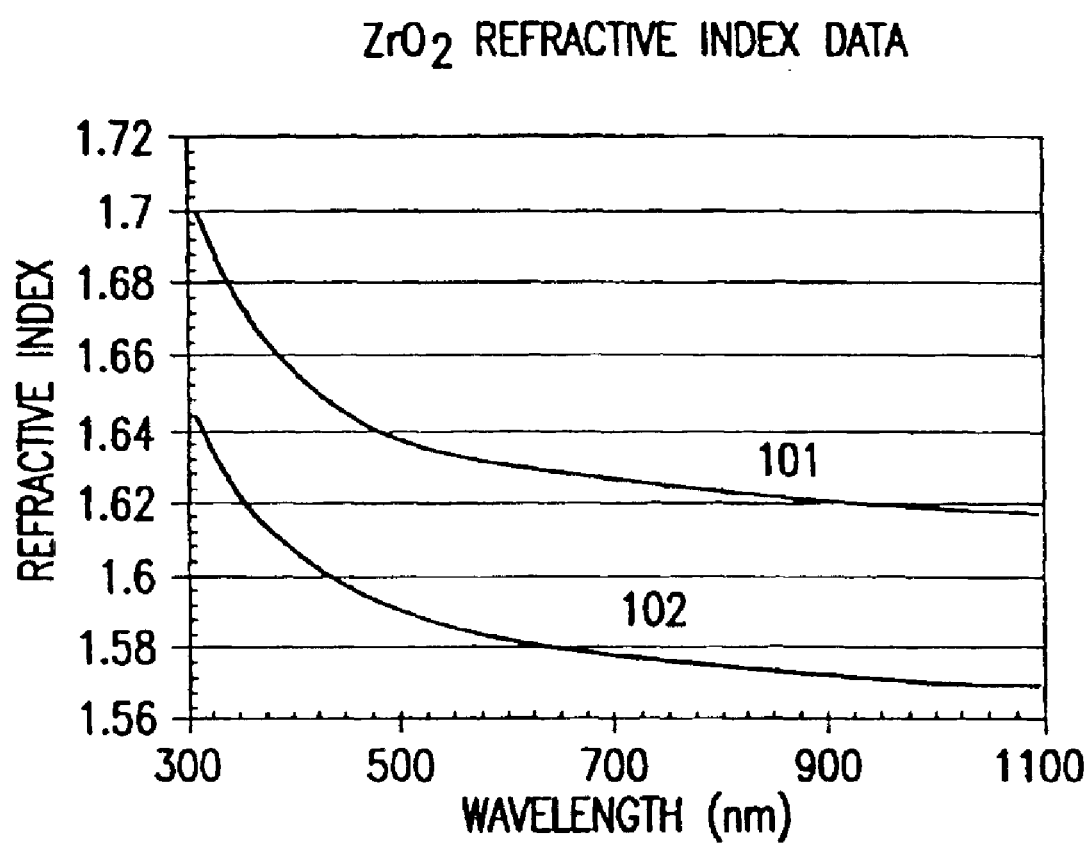
FIG. 14 shows the different refractive index properties exhibited by $ZrO_2$ films formed from two different precursors.

Two films of different zirconium-containing precursors, Zr(acetylacetonate)$_4$ (also known as Zr(acac)$_4$ and tetrakis (2,4-pentanedionato)zirconium(IV)) and Zr(carboxylate)$_4$ were cast by dissolving them in a suitable solvent and spin-coating the solution onto the surface of a silicon wafer. Each was subjected to prolonged blanket thermal treatment, i.e., until there were no further change in precursor film thickness. Following this treatment, the refractive index of each sample was measured as a function of wavelength using variable angle spectroscopic ellipsometry ("VASE"). The results are illustrated in FIG. 14. In FIG. 14, line 101 is from the sample formed from the Zr(acac)$_4$ precursor and line 102 is from the sample formed from the Zr(carboxylate)$_4$ precursor. These results demonstrate that there are significant differences in the refractive index properties for each of the samples which are directly related to the chemical composition of the precursor. The Zr(acac)$_4$ precursor forms a film with a refractive index about 3% greater than a film formed from Zr(carboxylate)$_4$.

Example 2

Two different copper precursors were initially prepared, $Cu_2(OH_2)_2(O_2C(CH_2)_4CH_3)_4$ and $(\mu-(C_2H_5)_2NCH_2CH_2O)_2 Cu_2(N_3)_2$. Each precursor is thought to undergo a photochemical reaction, which leads to the loss of the ligands and the production of copper atoms. The copper atoms are then thought to combine with each other to form either copper metal or to combine with oxygen to form copper oxide, however, the formation of the oxide may also occur as a result of the oxidation of first-formed copper metal. Based on the chemical prior art, there is no reason to postulate that these different precursors would provide different products under similar reaction conditions, although it has been recognized that the film forming properties and the efficiency of the reactions may vary widely as a result of the choice of precursor.

Accordingly, each of these two precursors was dissolved, each solution was deposited on silicon chips by spin-coating, and the precursor layer on each of the coated chips was substantially fully converted by photolysis with light in a vacuum. Photolysis was continued until no absorption associated with the ligands was observed in the FTIR spectra of the films. The samples were then transferred to a furnace and heated under nitrogen at 400° C.

Subsequently, each sample was examined by the well-known wide-angle x-ray diffraction method. It was found that the $Cu_2(OH_2)_2(O_2C(CH_2)_4CH_3)_4$ precursor yielded more copper oxide after conversion while the $(\mu-(C_2H_5)_2 NCH_2CH_2O)_2Cu_2(N_3)_2$ precursor yielded more crystalline metallic copper. These results demonstrate the dependence of the outcome of the process, i.e., after conversion, on the precursor composition in a way not previously envisioned by the art.

The method by which a film of a given precursor material is converted to an amorphous film, e.g., by a thermal or photolytic process, can have a significant impact, on the film's properties. This is shown in the data summarizing optical refractive index, and is also clearly demonstrated by a comparison of dielectric constant data, as illustrated in Examples 3 and 4.

Example 3

The precursor Zr(acac)$_4$ (zirconium(IV) acetylacetonate from Chemat Technology, Inc., Northridge, Calif.) was dissolved in toluene and the solution was spun onto silicon wafers at 1250 rpm for 30 seconds. The resulting unconverted precursor film had a thickness of 436 Å. Thermal conversion to $ZrO_2$ was carried out on a hotplate at 180° C. for 1 hour. Extended thermal conversion was carried out on a hotplate at 180° C. Photochemical conversion to $ZrO_2$ was carried out using a Karl Suss MJB-3 mask aligner with a 220 nm cold mirror. Due to the low intensity output of the mask aligner in the deep UV (about 0.38 mW/cm$^2$), an exposure time of 5 hours was used because this was found to be the dose where additional exposure does not lead to further thickness reduction. The thickness and refractive index a function of wavelength for the resulting films were mea sured using VASE. The measured thickness of these films were as follows:

| | |
|---|---|
| Unconverted Zr(acac)$_4$ Precursor | 436 Å |
| Thermally Converted | 360 Å |
| Extended Thermal Conversion | 316 Å |
| Photoconverted | 330 Å |

The precursor Zr(O(O)CC$_7$H$_{15}$)$_4$ (zirconium(IV) 2-ethyl hexanoate, from Chemat Technology, Inc., Northridge, Calif.) was dissolved in hexanes and the solution was spun onto silicon wafers at 1500 rpm for 30 seconds. The resulting unconverted precursor had a thickness of 2335 Å. Thermal conversion to ZrO$_2$ was carried out on a hotplate at 180° C. for 3 hours. Extended thermal conversion was carried out on a hotplate at 180° C. for a total of 6 hours, which includes the thermal conversion time of 3 hours. Photochemical conversion to ZrO$_2$ was carried out as described above for the ZrO(acac)$_2$ precursor except that, because of the low photosensitivity of the Zr(O(O)CC$_7$H$_{15}$)$_4$ precursor and the low exposure intensity, an exposure time of about 30 hours was used. Again, the thickness and refractive index as a function of wavelength for each resulting film was measured using VASE. The measured thickness of these films were as follows:

| | |
|---|---|
| Unconverted Zr(O(O)CC$_7$H$_{15}$)$_4$ Precursor | 2335 Å |
| Thermally Converted | 1141 Å |
| Extended Thermal Conversion | 977 Å |
| Photoconverted | 1487 Å |

Figure 15:
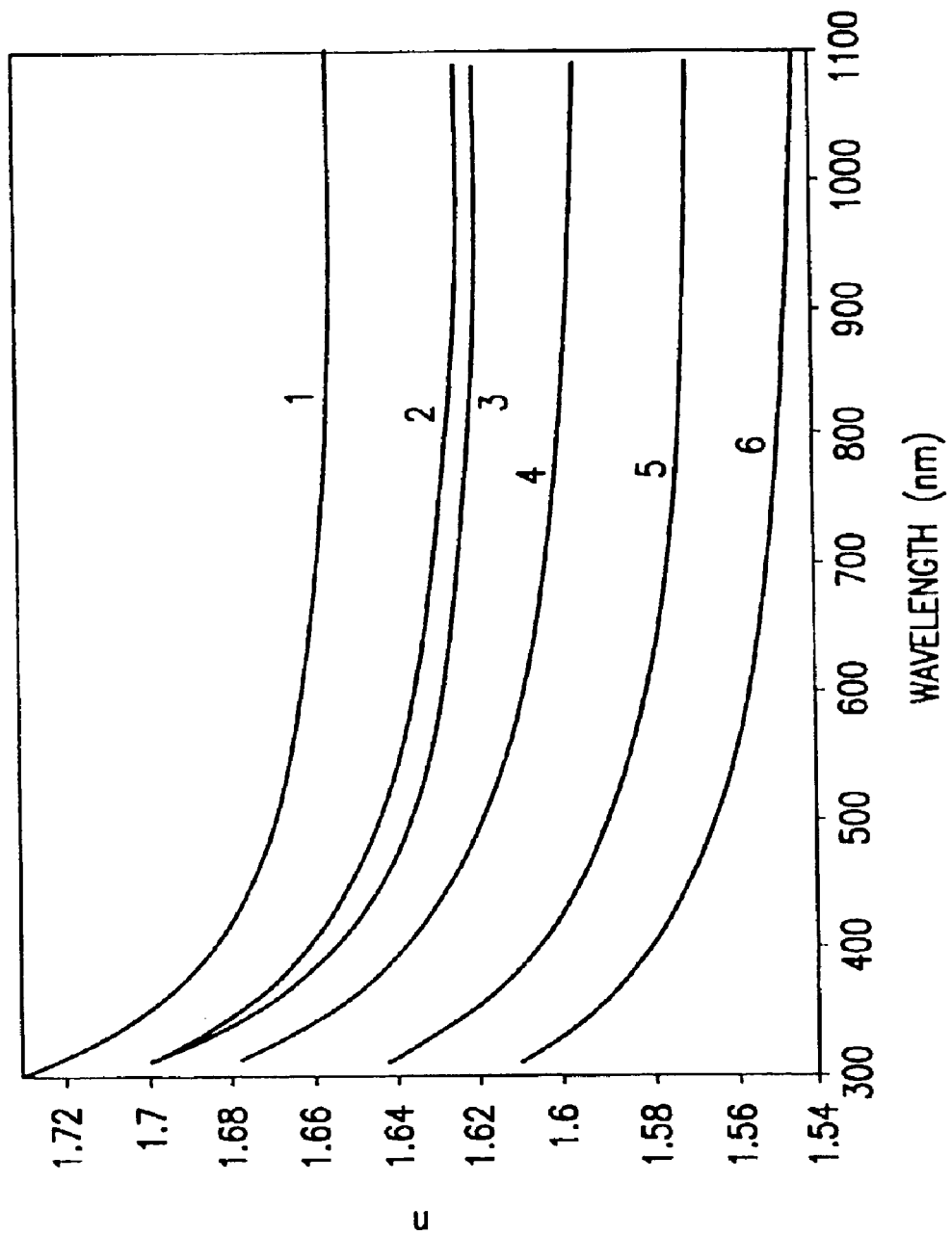
FIG. 15 shows the refractive indexes of various $ZrO_2$ films formed by thermal and photochemical conversion.

The refractive index results are shown in FIG. 15, where Zr(acac)$_4$ photochemically converted is line 1, Zr(acac)$_4$ thermally converted is line 2, Zr(O(O)CC$_7$H$_{15}$)$_4$ thermally converted is line 3, Zr(O(O)CC$_7$H$_{15}$)$_4$ photochemically converted is line 4, Zr(O(O)CC$_7$H$_{15}$)$_4$ converted by an extended thermal conversion is line 5, and Zr(acac)$_4$ converted by an extended thermal conversion is line 6.

These results demonstrate that there are significant differences in the refractive index properties for each of the samples which are directly related to the chemical composition of the precursor and to the method by which it was prepared.

Example 4

Aluminum-coated silicon wafers were spin-coated with approximately 7000 Å of a precursor designed to yield BST after at least partial conversion, in solution in hexanes. The precursor films of BST were prepared by dissolving 3.7 g Ti(bis(acetylacetonate)di(isopropoxide)), 2.8 g barium 2-ethylhexanoate and 5.6 g 2-ethylhexanoate (40% w/w in 2-ethylhexanoate acid) in 182 g hexanes, corresponding to a Ba:Sr:Ti(IV) molar ratio of 1:0.8:1. The precursor films were converted into BST films by either thermal treatment or photolytic treatment. The resulting thin BST films were fabricated into thin-film capacitors and film electrical properties were measured. The dielectric constant and average conductance value of each film differed dramatically, as can be seen from the following results:

| BST from Thermal Conversion | |
|---|---|
| Dielectric Constant | 4.66 |
| Average Conductance | 0.009992 µS |
| BST from Photochemical Conversion | |
| Dielectric Constant | 27.26 |
| Average Conductance | 0.04311 µS |

These results demonstrate that there are significant differences in the electrical properties for each of the samples which are directly related to the method by which the converted precursor was prepared.

Example 5

The choice of solvent in, for example, the spin-coating of film precursors, is an important because it may influence the optical quality of the film. For instance, this example demonstrates that casting of a film comprising precursors designed to be converted to BST yielded films of high optical quality from a solution in each of MIBK and n-heptane, while "streaky" films were formed from a solution of PGMEA.

Precursor solutions were formed in each of these three solvents by either dissolving the precursors in the solvent or replacing some or all of the solvent in the precursor solution with the desired solvent. Each solution was deposited onto an aluminum-covered Si wafer by spin-coating. The wafers were spun at 1500 rpm for 30 seconds. Spinning was followed by a bake on a hotplate at 110° C. for 2 minutes to remove any remaining solvent. The precursor films were converted to the oxide is using a Karl Suss MJB-3 mask aligner with a 220 nm cold mirror at an intensity of about 1.2 mW/cm 2. Each wafer was exposed for 1.5 hours to ensure complete conversion. After conversion, a development or removal step was performed in which the unconverted, unexposed portions of each precursor film were washed off by rinsing with the same solvent used in spin-coating that sample. Film thicknesses before conversion, i.e., unconverted, immediately after conversion, and after development were measured using VASE.

Figure 16:
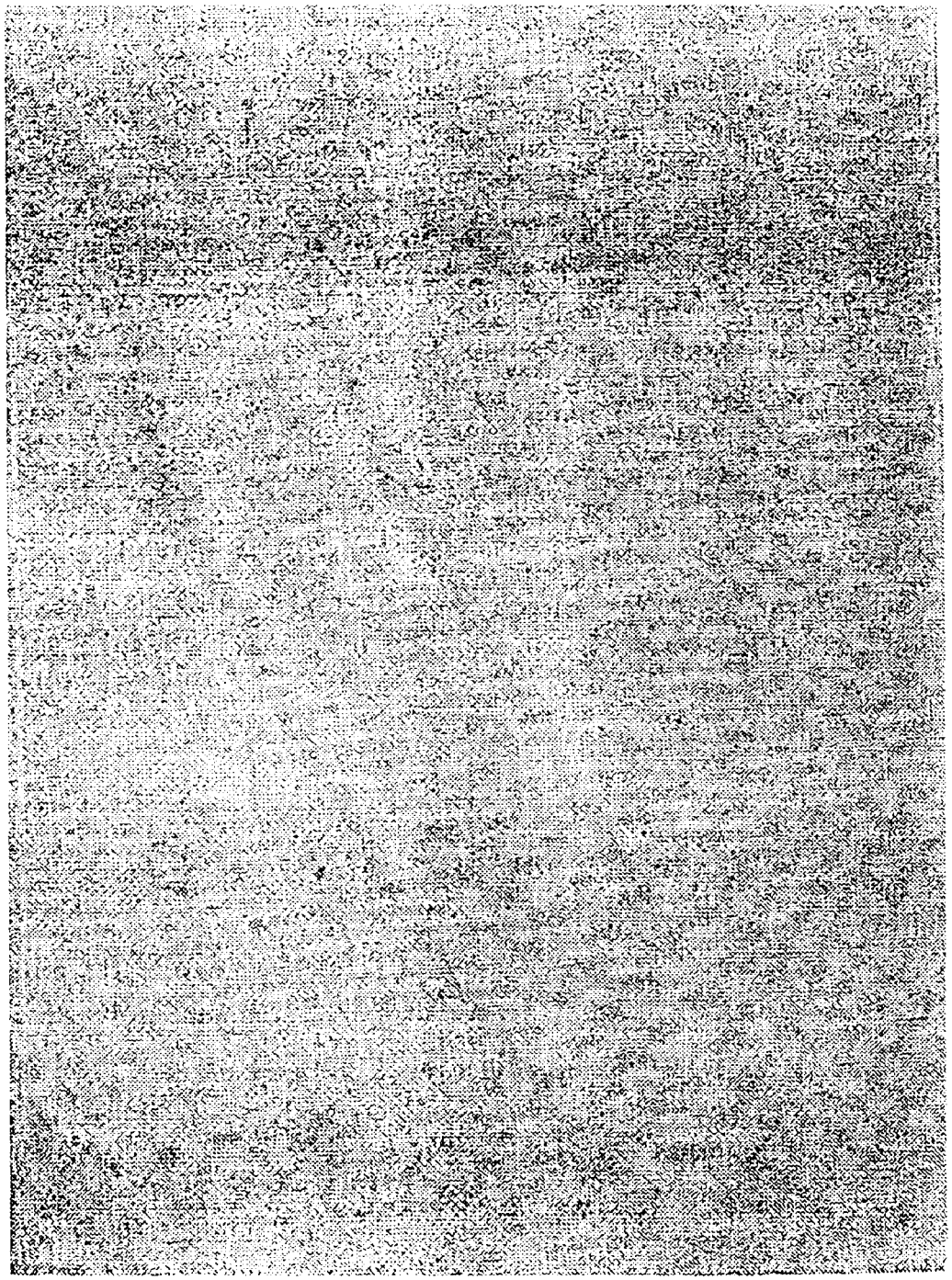
FIG. 16 depicts streaks caused by the use of a particular solvent after applying a precursor solution to a substrate.

A precursor film of high optical quality, such as those produced from MIBK and n-heptane, had a surface which is essentially featureless; therefore, no figures are included to show this. In contrast, the BST precursor film spin-coated from the PGMEA solution showed significant streaking, as can be seen from FIG. 16. Of the above solvents, MIBK produced the most uniform and reproducible films.

Example 6

Figure 17:
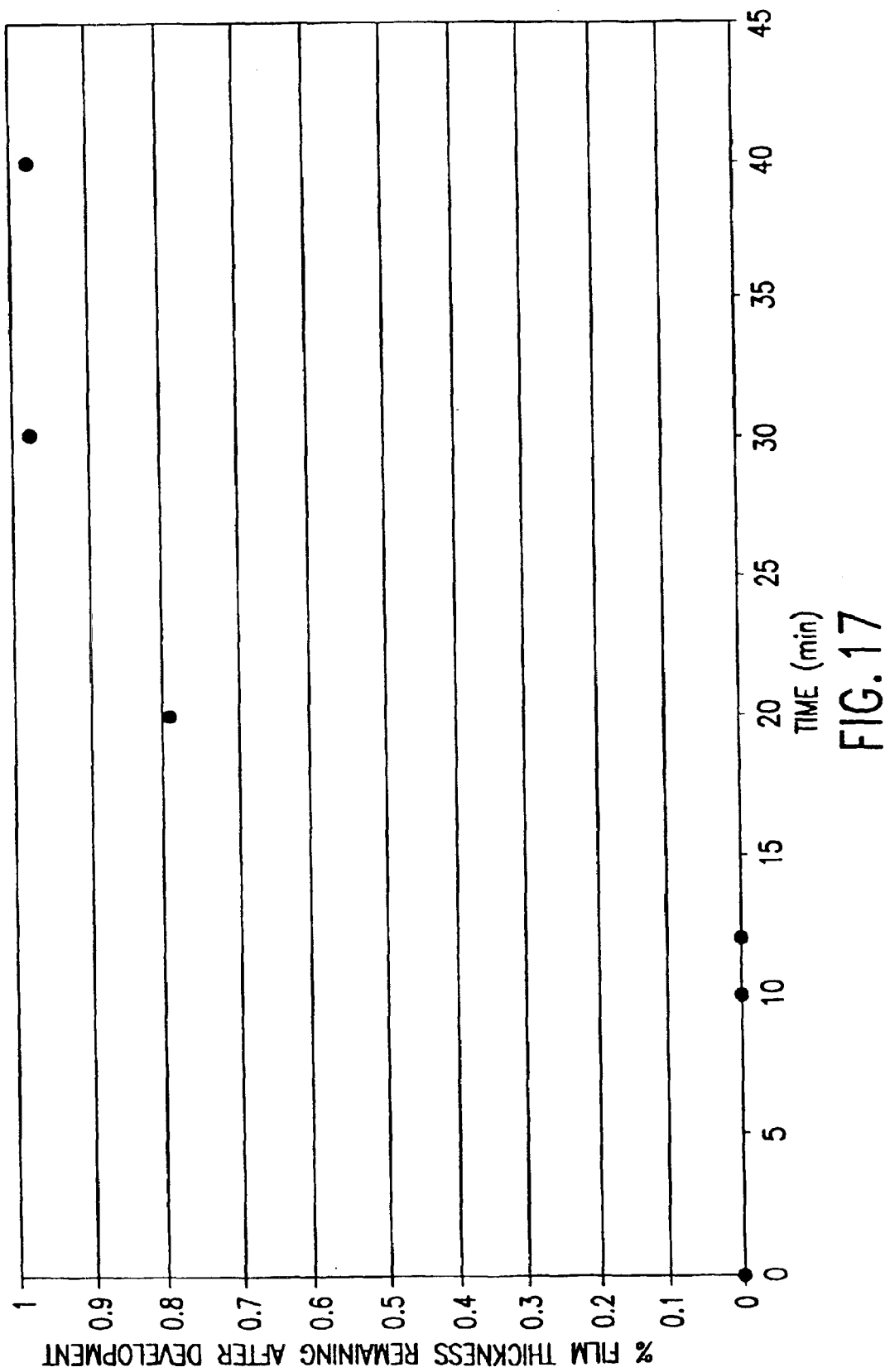
FIG. 17 shows a thermal contrast curve for BST.

In an example of how thermal treatment may be used to convert a precursor film to an amorphous film of desired material, a series of bare silicon wafers was spin-coated with a solution of precursor designed to form BST upon conversion. The wafers were subjected to at least a partial conversion step by heating each on a hotplate at 160° C. for a total time of 120 minutes in intervals of 10 minutes. After each conversion interval, the precursor pattern was developed by rinsing with isopropanol to remove the unconverted precursor. This allowed for a determination of the time required to thermally print the film, i.e., to have a substantial amount of film remaining after development with IPA. As shown in the FIG. 17, this time was determined to be approximately 20 minutes for thermal conversion.

Figure 18:
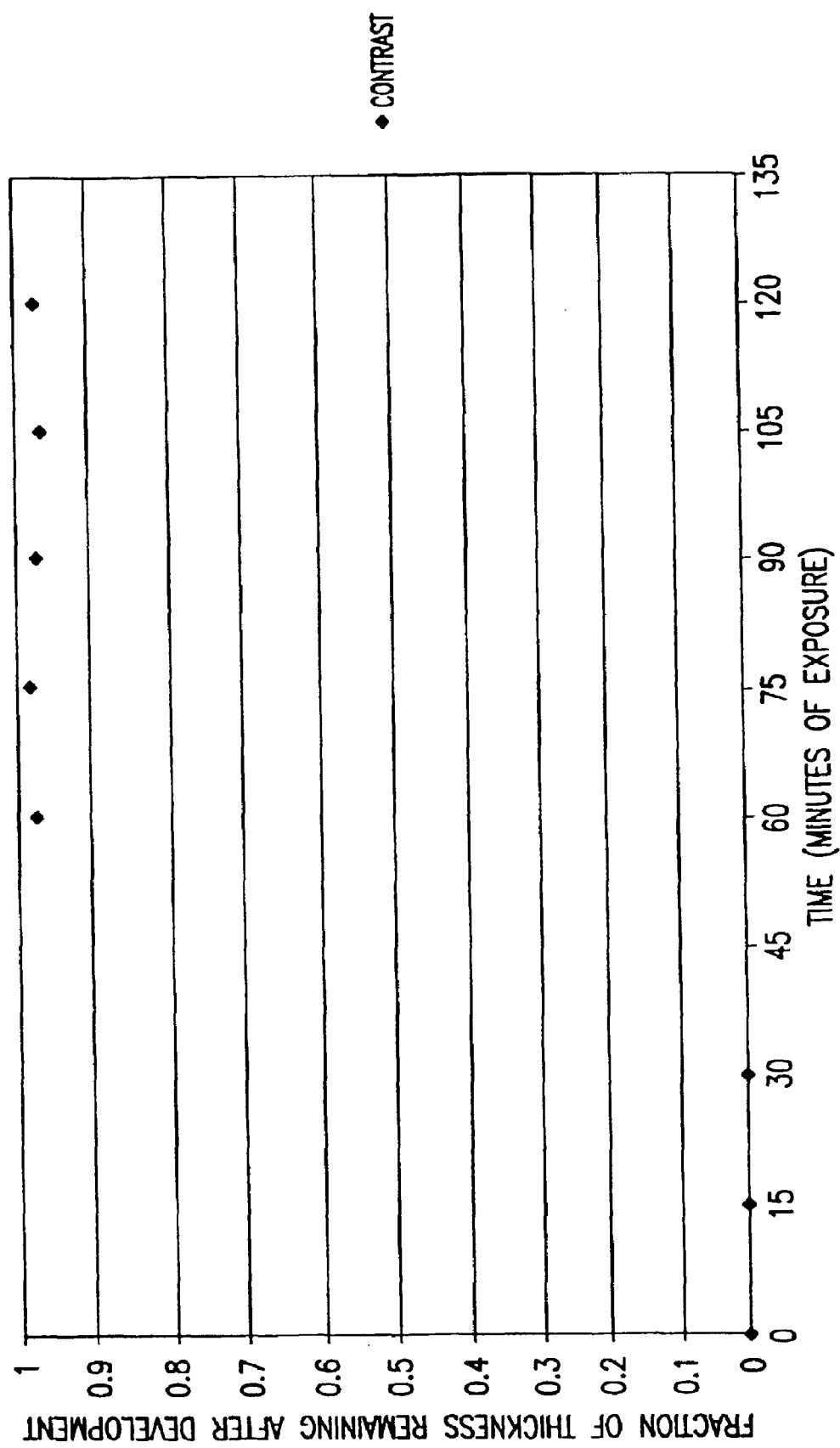
FIG. 18 shows a photochemical contrast curve for BST.
Figure 19:
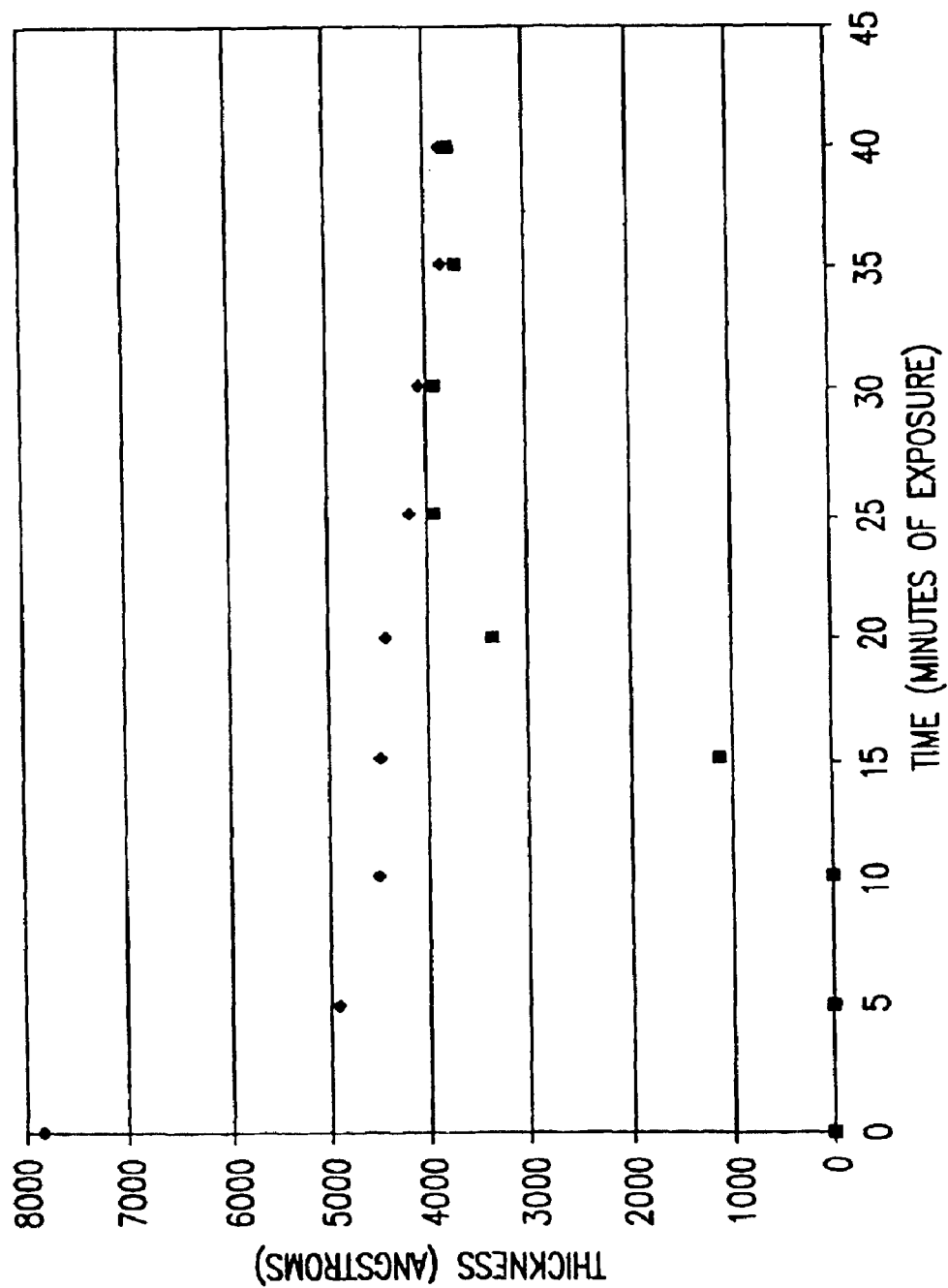
FIG. 19 shows a combined thermal/photochemical contrast curve for BST.

A similar experiment was conducted by substituting, for thermal conversion, photochemical conversion; these results are shown in FIG. 18. This figure demonstrates that the time required to photochemically print the film was in the range of 30 to 60 minutes. In a third experiment, designed to combine thermal partial conversion or pretreatment with photochemical conversion, wafers were subjected to a thermal pretreatment of 160° C. for 10 minutes, then subjected to the above-described photochemical conversion procedure. The thermal/photochemical print results are illustrated in FIG. 19, which demonstrates that the time required for conversion by the combined thermal/photochemical conversion process, i.e., about the minimum time needed to form a pattern, has been reduced to approximately 20 minutes from 30 to 60 minutes for photochemical conversion alone.

Example 7

The resolution of an optical projection system can be improved by reducing the wavelength of the imaging light and by increasing the numerical aperture of the lens system. However, the ability to keep the image in focus throughout the resist decreases as its thickness increases. The depth of focus can be maintained by decreasing the thickness of the resist film, however, the minimum resist thickness is limited by the etch requirements needed for pattern transfer steps. In order to alleviate depth of focus limitations, thin film imaging has been used to pattern only the top layer of the resist. After imaging the resist top layer, the pattern is developed and then transferred to the substrate using an etch process.

For a bilayer approach using metal complex precursors, a two stack film comprising an underlayer and a metal complex precursor can be used, with each layer, e.g., spin-coated. The metal complex precursor serves the need for an etch mask while the underlayer is used to transfer the pattern to the substrate by etching. Three different underlayers were tested: PMMA, PHOST and Novolac. PHOST and Novolac were hard baked on the hotplate at 160° C. for 2 hours prior to spin-coating of the metal complex precursors. The metal complex precursors used in the experiment were designed to form BST, PZT or titanium dioxide ($TiO_2$). The BST precursor was prepared according to the procedure described in Example 4. The PZT precursor was prepared by dissolving 18.48 g of lead(II) 2-ethylhexanoate in 57.4 g hexanes and adding 24.2 g zirconium(IV) 2-ethylhexanoate and 9.5 g Ti(bis(acetylacetonate)di(isopropoxide)) followed by the addition of 327 g of additional hexanes, corresponding to a Pb(II):Zr(IV):Ti(IV) molar ratio of 2.5:1:1.3. The following table lists the different combinations used and whether the underlayer and metal complex precursor were deemed to be compatible.

| Underlayer | Precursor | Relative Compatibility Using Hexanes Casting Solvent |
|---|---|---|
| PMMA | BST | Poor |
| PMMA | PZT | Poor |
| PHOST | BST | Poor |
| PHOST | PZT | Poor |
| Novolac | BST | Good |
| Novolac | PZT | Good |
| Novolac | $TiO_2$ | Good |

Hard baked Novolac was found to be compatible with BST, PZT and $TiO_2$ precursors, while the PMMA and PHOST underlayer materials tested dissolved during spin-coating of the metal complex layer. PMMA and PHOST dissolved away in the presence of the casting solvent hexanes used for the BST and PZT precursors. The compatibility of hard baked Novolac with BST and PZT precursors allowed for patterning and transfer of the pattern.

Example 8

Figure 20:
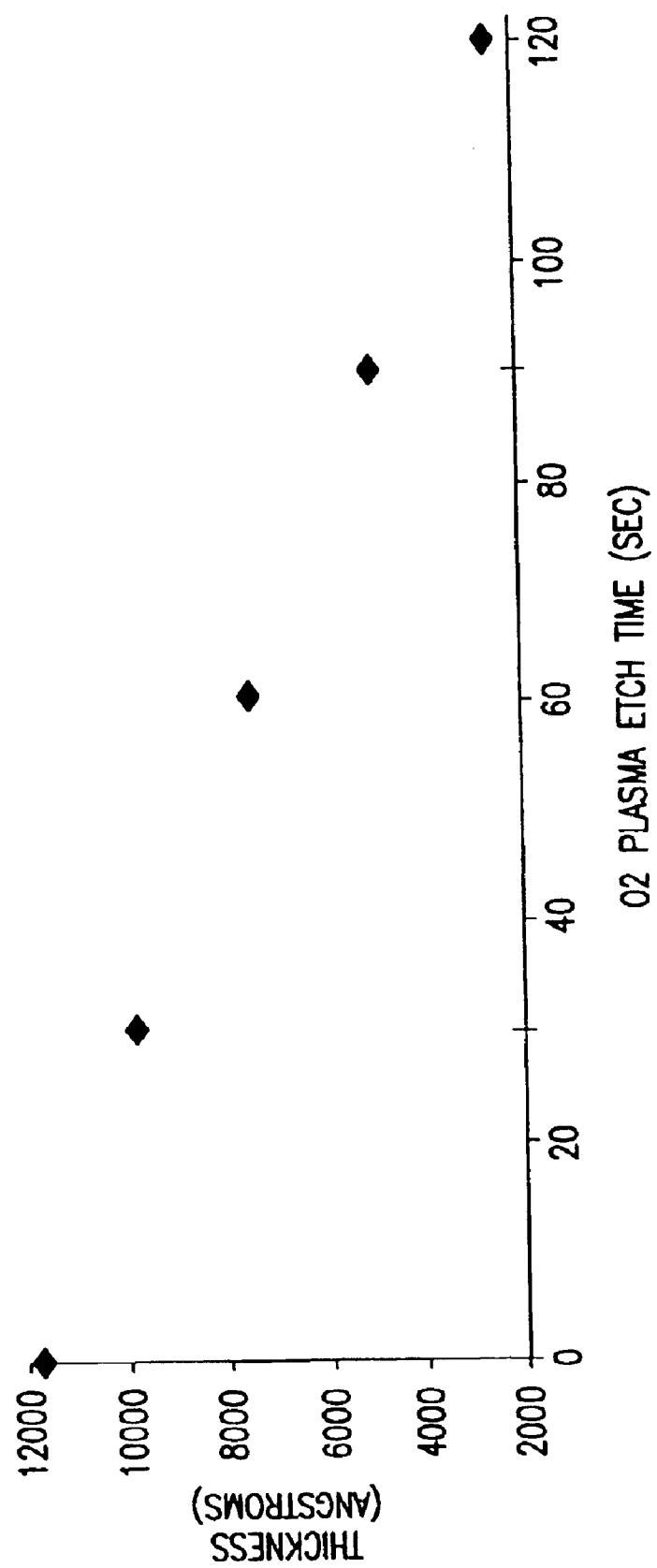
FIG. 20 is a plot of thickness versus etching time for hard baked Novolac.
Figure 21:
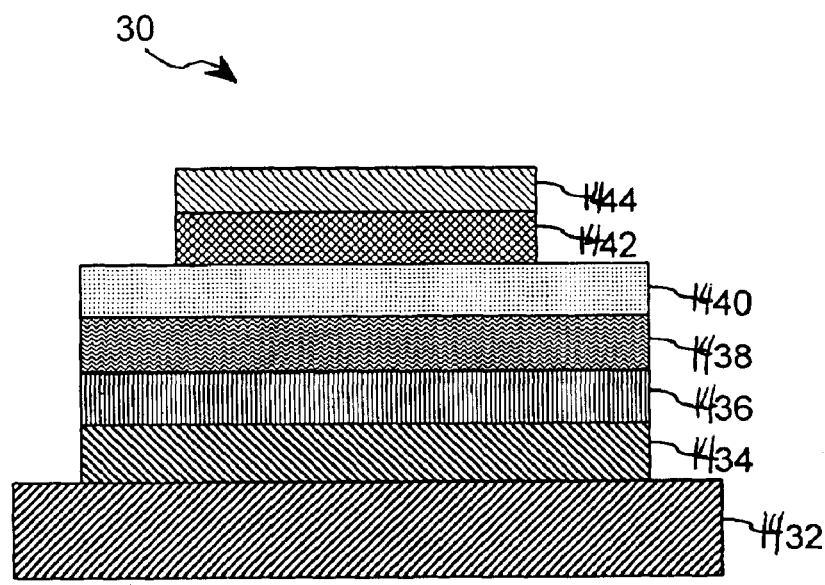
FIG. 21 is an cross section of an organic light emitting diode.

The etch selectivity between the hard baked Novolac and two metal complexes was determined by monitoring the thickness change upon etching. The samples of hard baked Novolac and a fully converted PZT or $TiO_2$, prepared according to Example 7, were loaded into the etching chamber and etched with an oxygen plasma for 30 second intervals up to a total of at least 120 seconds. The sample thickness was measured after each etch interval. The etch rate for each sample was determined from the slope of a plot of thickness versus etching time. Plots of thickness versus etching time of hard baked Novolac is shown in FIG. 20 while the same plots are shown in FIG. 21 for fully converted PZT and $TiO_2$. The following table lists the respective slopes and correlation coefficients of the linear least-squares lines.

| Layer Being Oxygen Etched | Slope of Thickness v. Etching Time Plot | Correlation Coefficient |
|---|---|---|
| Hard Baked Novolac | −76.3 | 0.999 |
| Fully Converted PZT | −0.195 | 0.985 |
| Fully Converted $TiO_2$ | −0.0866 | 0.992 |

The etch selectivity was determined from the ratio of the slope of the respective etch rate plots. The etch selectivity between hard baked Novolac and fully converted PZT is about 390:1. The etch selectivity between hard baked Novolac and fully converted $TiO_2$ is about 880:1. The etch selectivity of $TiO_2$ is comparable with that of $SiO_2$ under the same conditions.

Example 9

E-Beam contrast of BST and PZT was performed to determine the photospeed of these materials by exposing a series of fully converted films of each material to increasing doses of the e-beam and noting, after development, the highest dose at which the fraction of film remained at zero and the lowest dose at which the fraction of film remaining reached a value of about 1. The contrast for PZT and BST occurs at about the same range for each, from about 60 to about 100 $\mu C/cm^2$.

Example 10

Titanium dioxide deposited at low temperature (less than 40° C.) using PMOD methodology (refractive index of 2.05 at 630 nm) has a density approximately 90% that of crystalline (anatase phase) titanium dioxide (refractive index of 2.3 at 630 nm). Density has been shown to be a function of precursor structure, UV conversion, and post-UV conversion processing. Post-UV conversion processing at temperatures less than 300° C. has resulted in patterned deposition of titanium dioxide with a density 95% that of crystalline (anatase phase) titanium dioxide (refractive index of 2.16 at 630 nm).

Example 11

The following procedure was used to deposit a barrier layer. A 100-mm silicon wafer was spin coated using a CEE Model 100CV spin coater with TOK OFPR 800 20 photoresist at 5000 rpm over 20 seconds. The film was baked on a hot plate at 230° C. for 5 minutes on a MTI FlexiFab system. This yielded a film of approximately 5000 Å. A layer of PMOD TiO$_2$ precursor (Ti(O(CH$_2$)$_3$(CH$_3$))$_2$(OOCCH (CH$_2$CH$_3$)(CH$_2$)$_3$CH$_3$)$_2$) was spin coated on the photoresist. The PMOD precursor was converted using a conveyor type UV curing unit (UVESX Model CCU, 2 passes) resulting in a PMOD TiO$_2$ film of 170Å. The coated substrate was then subjected to an oxygen plasma using a Branson/IPC P2100 Nonprecision Barrel System (P(O$_2$)=1 torr, 1000W, 30 minutes). The PMOD TiO$_2$ layer was then removed by immersion in CuSolve™ EKC 5800™ Cu in a static bath for 10 minutes at room temperature. After processing, the substrates are rinsed in DI water and dried in a nitrogen gas stream. The surface of the photoresist was examined using Scanning Electron Microscopy (FEI XL 830 SEM/FIB). The samples were coated using a Denton Vacuum Desk II sputter tool with gold to prevent charging in the SEM and the images obtained using an accelerating potential of 10 keV.

The experiment was repeated with three layers of PMOD TiO$_2$ (total PMOD TiO$_2$ thickness of approximately 500Å). The use of multiple layers was used to minimize defects that could compromise the barrier layer. Using multiple layers of the PMOD TiO$_2$ shows elimination of defects in the polymer film after exposure to an oxygen plasma.

One skilled in the art will appreciate that the scope of the present invention is not limited to that which is expressly disclosed herein but includes extensions.

All references cited herein are incorporated herein by reference in their entirety and for all purposes to the same extent as if each individual publication or patent or patent application was specifically and individually indicated to be incorporated by reference in its entirety for all purposes. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of forming a barrier layer on a substrate comprising the steps of:
   selecting at least one precursor material;
   depositing substantially amorphous layer comprising the precursor atop a substrate;
   converting at least a portion of the precursor layer; and
   developing the precursor layer.

2. The method of claim 1, further comprising developing away an unconverted portion of the precursor layer with a developer.

3. The method of claim 1, wherein the substrate is flexible.

4. The method of claim 3, wherein the substrate is plastic.

5. The method of claim 1, further comprising selecting the at least one precursor material from a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

6. The method of claim 1, wherein the barrier layer is transparent.

7. A photoresist-free method of forming a barrier layer on a substrate, comprising the steps of:
   selecting at least one precursor material;
   depositing a substantially amorphous layer comprising the unconverted precursor atop the substrate;
   exposing at least a portion of the unconverted precursor to electromagnetic radiation;
   substantially removing at least a portion of the unconverted precursor to leave an amorphous film with barrier layer properties; wherein said substrate is flexible.

8. The method of claim 7, further comprising converting with an energy source selected from light, electron beam irradiation, ion beam irradiation, and mixtures thereof.

9. The method of claim 8, further comprising substantially removing at least a portion of the unconverted precursor layer by using a developer.

10. The method of claim 7, further comprising selecting the at least one precursor material from a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

11. The method of claim 1, wherein the barrier layer is formed at about ambient temperature.

12. The method of claim 7, wherein the barrier layer is formed at about ambient temperature.

13. A method of forming a barrier layer on a substrate comprising the steps of:
   selecting at least one precursor material;
   forming a substantially amorphous layer comprising the precursor over a substrate;
   converting at least a portion of the precursor layer at about ambient temperature.

14. The method of claim 13, wherein the substrate is flexible.

15. The method of claim 14, wherein the substrate is plastic.

16. The method of claim 13, further comprising selecting the at least one precursor material from a metal complex comprising at least one ligand selected from the coup consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

17. The method of claim 13, further comprising developing away an unconverted portion of the precursor layer with a developer.

* * * * *